(12) United States Patent
Zhu et al.

(10) Patent No.: US 12,501,805 B2
(45) Date of Patent: Dec. 16, 2025

(54) DISPLAY PANEL AND DISPLAY DEVICE

(71) Applicant: BOE TECHNOLOGY GROUP CO., LTD., Beijing (CN)

(72) Inventors: Wenxiu Zhu, Beijing (CN); Hongli Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 554 days.

(21) Appl. No.: 17/919,818

(22) PCT Filed: Dec. 16, 2021

(86) PCT No.: PCT/CN2021/138898
§ 371 (c)(1),
(2) Date: Oct. 19, 2022

(87) PCT Pub. No.: WO2023/108565
PCT Pub. Date: Jun. 22, 2023

(65) Prior Publication Data
US 2024/0215368 A1   Jun. 27, 2024

(51) Int. Cl.
*H10K 59/35* (2023.01)
*H10K 59/122* (2023.01)

(52) U.S. Cl.
CPC ......... *H10K 59/353* (2023.02); *H10K 59/352* (2023.02); *H10K 59/122* (2023.02)

(58) Field of Classification Search
CPC .. H10K 59/353; H10K 59/352; H10K 59/122; G09G 3/3208
See application file for complete search history.

(56) References Cited

U.S. PATENT DOCUMENTS

| | | |
|---|---|---|
| 2011/0260951 A1 | 10/2011 | Hwang et al. |
| 2017/0053624 A1 | 2/2017 | Hayashi et al. |
| 2017/0249889 A1 | 8/2017 | Wang et al. |
| 2017/0352710 A1 | 12/2017 | Hong et al. |
| 2019/0058017 A1 | 2/2019 | Du |
| 2020/0152712 A1 | 5/2020 | Chung et al. |
| 2020/0402442 A1 | 12/2020 | Liu et al. |

FOREIGN PATENT DOCUMENTS

| | | |
|---|---|---|
| CN | 111415961 A | 7/2020 |
| CN | 112151590 A | 12/2020 |
| CN | 112201681 A | 1/2021 |
| CN | 112366219 A | 2/2021 |
| CN | 112436029 A | 3/2021 |

*Primary Examiner* — Elmito Breval
(74) *Attorney, Agent, or Firm* — Dority & Manning, P.A.

(57) ABSTRACT

A display panel includes a substrate and a plurality of sub-pixels each having a light-emitting region. The plurality of sub-pixels are divided into a plurality of first pixel columns and a plurality of second pixel columns that all extend in a first direction and are disposed alternately in a second direction. A first pixel column includes first pixel groups and third pixel groups that are disposed alternately in the first direction, a first pixel group includes two first sub-pixels disposed in the first direction, and a third pixel group includes two third sub-pixels disposed in the first direction. A second pixel column includes second pixel groups disposed sequentially in the first direction, a second pixel group includes two second sub-pixels disposed in the first direction, and geometric centers of light-emitting regions of the two second sub-pixels are located on two straight lines extending in the first direction.

20 Claims, 16 Drawing Sheets

DISPLAY PANEL AND DISPLAY DEVICE

CROSS-REFERENCE TO RELATED APPLICATION

This application is a national phase entry under 35 USC 371 of International Patent Application No. PCT/CN2021/138898, filed on Dec. 16, 2021, which is incorporated herein by reference in its entirety.

TECHNICAL FIELD

The present disclosure relates to the field of display technologies, and in particular, to a display panel and a display device.

BACKGROUND

With the continuous development of display technologies, active matrix organic light-emitting diode (AMOLED) display devices have been widely used due to their characteristics such as full screen, narrow bezel, high resolution, curling wearing and foldable design.

At present, a display screen of the display device has an increasing number of pixels per inch (PPI, which is used to characterize a pixel density). How to improve a display effect of the display device while ensuring a high PPI and a high aperture ratio is an issue that has been always explored in the industry.

SUMMARY

In an aspect, a display panel is provided. The display panel includes a substrate and a plurality of sub-pixels disposed on the substrate. Each sub-pixel has a light-emitting region.

The plurality of sub-pixels are divided into a plurality of first pixel columns and a plurality of second pixel columns, the plurality of first pixel columns and the plurality of second pixel columns all extend in a first direction, and the plurality of first pixel columns and the plurality of second pixel columns are disposed alternately in a second direction. The first direction and the second direction intersect. A first pixel column includes a plurality of first pixel groups and a plurality of third pixel groups that are disposed alternately in the first direction, a first pixel group includes two first sub-pixels disposed sequentially in the first direction in the plurality of sub-pixels, and a third pixel group includes two third sub-pixels disposed sequentially in the first direction in the plurality of sub-pixels. A second pixel column includes a plurality of second pixel groups disposed sequentially in the first direction, a second pixel group includes two second sub-pixels disposed sequentially in the first direction in the plurality of sub-pixels, and geometric centers of light-emitting regions of the two second sub-pixels are located on two straight lines extending in the first direction.

In some embodiments, geometric centers of light-emitting regions of the two first sub-pixels are located on another two straight lines extending in the first direction. And/or, geometric centers of light-emitting regions of the two third sub-pixels are located on another two straight lines extending in the first direction.

In some embodiments, an area of a light-emitting region of a third sub-pixel is greater than an area of a light-emitting region of a first sub-pixel, and the area of the light-emitting region of the third sub-pixel is greater than an area of a light-emitting region of a second sub-pixel.

In some embodiments, in a same second pixel column, light-emitting regions of a plurality of second sub-pixels are located between a first reference line and a second reference line, and at least one side or at least one point of a light-emitting region of a second sub-pixel in the plurality of second sub-pixels is located on the first reference line, and at least another side or at least another point of the light-emitting region of the second sub-pixel in the plurality of second sub-pixels is located on the second reference line. The first reference line and the second reference line both extend in the first direction, and are disposed in parallel in the second direction.

In some embodiments, the light-emitting regions of the two second sub-pixels in the second pixel group have substantially a same shape, and the two light-emitting regions are disposed centrosymmetrically.

In some embodiments, in the two second sub-pixels located in the second pixel group, a side of a light-emitting region of one second sub-pixel is adjacent to and parallel to a side of a light-emitting region of another second sub-pixel. Alternatively, in the two second sub-pixels located in the second pixel group, a portion of a border of the light-emitting region of the one second sub-pixel is adjacent to a portion of a border of the light-emitting region of the another second sub-pixel, and in the two adjacent portions of the borders, a tangent of at least one point on one portion and a tangent of at least one point on another portion are parallel to each other.

In some embodiments, the light-emitting regions of the two second sub-pixels are each in a shape of a trapezoid, a bow, a triangle, or a polygon with at least five sides.

In some embodiments, the light-emitting regions of the two second sub-pixels are each in a shape of a trapezoid; a light-emitting region includes a bottom base and a top base, and the bottom base and the top base of the light-emitting region both extend in the first direction. In the two second sub-pixels located in the second pixel group, a bottom base of a light-emitting region of one second sub-pixel and a top base of a light-emitting region of another second sub-pixel are located on a same straight line extending in the first direction.

In some embodiments, the light-emitting regions of the two second sub-pixels are each in a shape of an isosceles trapezoid, and the light-emitting region further includes two legs. In the two second sub-pixels located in the second pixel group, a leg of the light-emitting region of the one second sub-pixel is adjacent to and parallel to a leg of a light-emitting region of the another second sub-pixel.

In some embodiments, the light-emitting regions of the two second sub-pixels are each in a shape of a right trapezoid, and the light-emitting region further includes a leg, and a right-angled side perpendicular to the bottom base and the top base. In the two second sub-pixels located in the second pixel group, a leg of the light-emitting region of the one second sub-pixel is adjacent to and parallel to a leg of the light-emitting region of the another second sub-pixel.

In some embodiments, the light-emitting regions of the two second sub-pixels are each in a shape of a triangle, and a light-emitting region includes a base side extending in the first direction. In the two second sub-pixels located in the second pixel group, a vertex corresponding to a base side of a light-emitting region of one second sub-pixel and a base side of a light-emitting region of another second sub-pixel are located on a same straight line extending in the first direction.

In some embodiments, the light-emitting regions of the two second sub-pixels are each in a shape of an isosceles triangle, and the light-emitting region further includes two legs. In the two second sub-pixels located in the second pixel group, a leg of the light-emitting region of the one second sub-pixel is adjacent to and parallel to a leg of the light-emitting region of the another second sub-pixel.

In some embodiments, the light-emitting regions of the two second sub-pixels are each in a shape of a right triangle, and the light-emitting region further includes a long right-angled side and a short right-angled side. In the two second sub-pixels located in the second pixel group, a long right-angled side of the light-emitting region of the one second sub-pixel is adjacent to and parallel to a long right-angled side of the light-emitting region of the another second sub-pixel.

In some embodiments, the light-emitting regions of the two second sub-pixels are each in a shape of a bow, a light-emitting region includes a base side and a curved side connected to the base side, and the base side extends in the first direction. In the two second sub-pixels located in the second pixel group, a base side of a light-emitting region of one second sub-pixel and a point farthest from a base side on a curved side of a light-emitting region of another second sub-pixel are located on a same straight line extending in the first direction.

In some embodiments, the light-emitting regions of the two second sub-pixels are each in a shape of a pentagon, and a light-emitting region includes a base side, two right-angled sides respectively connected to both ends of the base side and perpendicular to the base side, and two legs respectively connected to the two right-angled sides. The base side extends in the first direction, the two legs are connected to each other, and a connection point of the two legs is a vertex. In the two second sub-pixels located in the second pixel group, a base side of a light-emitting region of one second sub-pixel and a vertex of a light-emitting region of another second sub-pixel are located on a same straight line extending in the first direction, and a right-angled side of the light-emitting region of the one second sub-pixel is adjacent to and parallel to a right-angled side of the light-emitting region of the another second sub-pixel.

In some embodiments, the light-emitting regions of the two second sub-pixels are each in a shape of a hexagon, and a light-emitting region includes a base side, two right-angled sides respectively connected to both ends of the base side and perpendicular to the base side, two legs respectively connected to the two right-angled sides, and a top side connected to the two legs. The base side and the top side extend in the first direction. In the two second sub-pixels located in the second pixel group, a base side of a light-emitting region of one second sub-pixel and a top side of a light-emitting region of another second sub-pixel are located on a same straight line extending in the first direction, and a right-angled side of the light-emitting region of the one second sub-pixel is adjacent to and parallel to a right-angled side of the light-emitting region of the another second sub-pixel.

In some embodiments, a second sub-pixel is capable of emitting a green light, a first sub-pixel is capable of emitting one of red light and blue light, and a third sub-pixel is capable of emitting another of the red light and the blue light.

In some embodiments, the plurality of sub-pixels are divided into a plurality of pixel rows, the plurality of pixel rows extend in the second direction, and the plurality of pixel rows are arranged in parallel in the first direction. A pixel row includes a plurality of pixel units disposed sequentially in the second direction, and a pixel unit includes a first pixel group, a second pixel group and a third pixel group. Pixel units of two adjacent pixel rows are disposed in a staggered manner in the second direction.

In some embodiments, the display panel further includes a pixel defining layer and a light-emitting layer. The pixel defining layer includes a plurality of openings, the light-emitting layer includes a plurality of light-emitting patterns, and the two second sub-pixels of the second pixel group share a same light-emitting pattern. A light-emitting pattern corresponds to two openings, and at least part of the light-emitting pattern is located in the two corresponding openings. Geometric centers of the two openings are located on two straight lines extending in the first direction.

In another aspect, a display device is provided. The display device includes the display panel as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
FIG. 1 is a top view of a display device, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "electrically connected" and "connected" and derivatives thereof may be used. For example, the term "electrically connected" may be used in the description of some embodiments to indicate that two or more components are in direct physical contact or electrical contact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

In the description of the present disclosure, it will be understood that, orientations or positional relationships indicated by the terms such as "center", "longitudinal", "transverse", "length", "width", "vertical", "horizontal", "inner", "outer" are based on orientations or positional relationships shown in the drawings, which is merely for convenience in description of the present disclosure and simplifying the description, but not to indicate or imply that the indicated apparatus or element must have a specific orientation, or be constructed and operated in a specific orientation. Therefore, they cannot be construed as limitations of the present disclosure.

It will be understood that, in a case where a layer or element is referred to be on another layer or substrate, it may be that the layer or element is directly on the another layer or substrate, or it may be that there is intermediate layer(s) between the layer or element and the another layer or substrate.

Exemplary embodiments are described herein with reference to sectional views and/or plan views as idealized exemplary drawings. In the accompanying drawings, thickness of layers and sizes of regions are enlarged for clarity. Variations in shapes relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in a device, and are not intended to limit the scope of the exemplary embodiments.

FIG. 1 is a top view of a display device provided by some embodiments of the present disclosure. The display device 100 may be any device that displays images whether in motion (e.g., a video) or stationary (e.g., a still image), and regardless of text or image. More specifically, the anticipated embodiments may be implemented in or associated with a variety of electronic devices. The variety of electronic devices may include (but are not limit to), for example, mobile telephones, wireless devices, personal digital assistants (PDA), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packaging and aesthetic structures (e.g., a display for displaying an image of a piece of jewelry). FIG. 1 illustrates the display device 100 being a mobile phone as an example.

As shown in FIG. 1, the display device 100 includes a display panel 200, and the display panel 200 may be an organic light-emitting diode (OLED) display panel.

Figure 2:
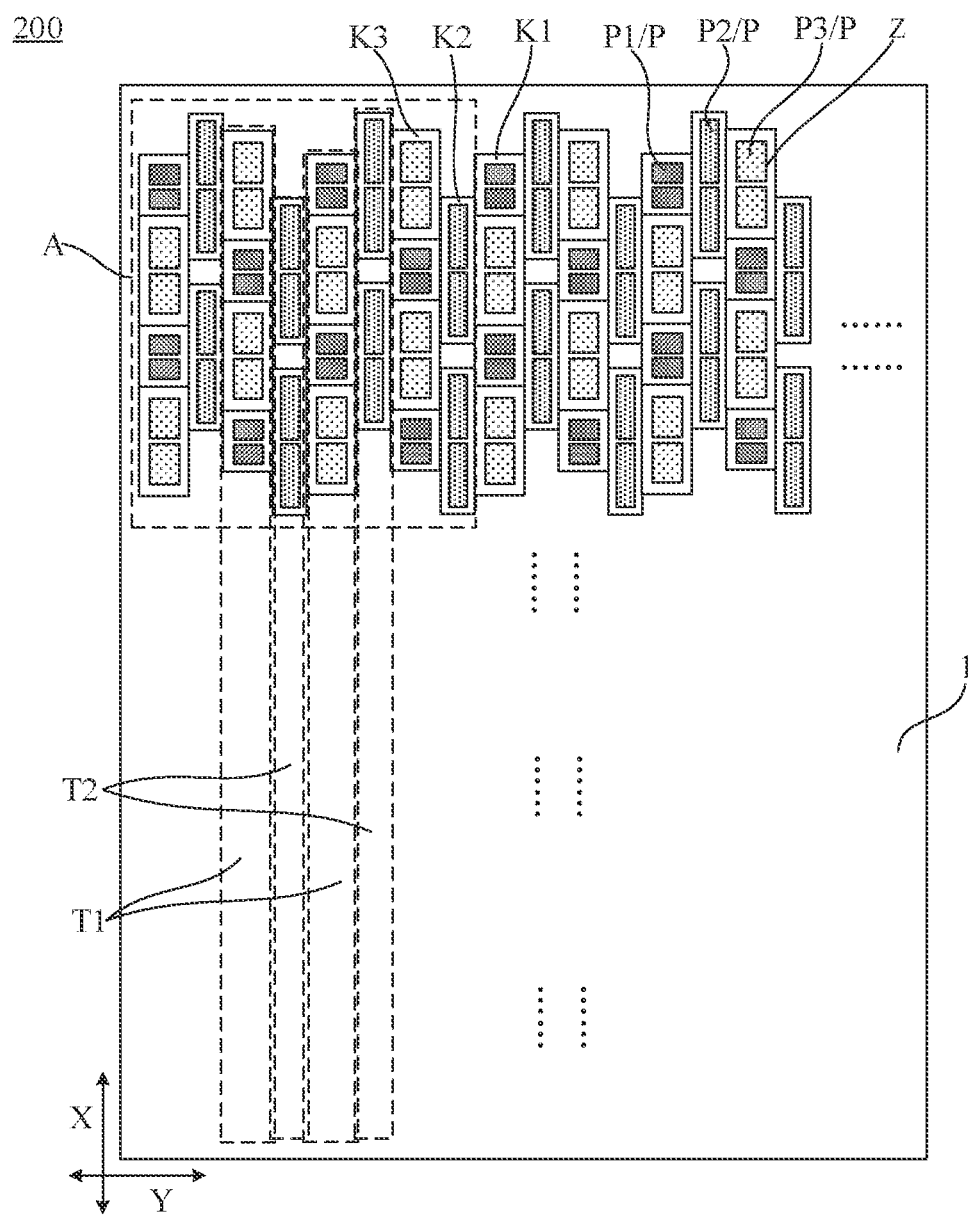
FIG. 2 is a top view of a display panel, in accordance with some embodiments.
Figure 4:
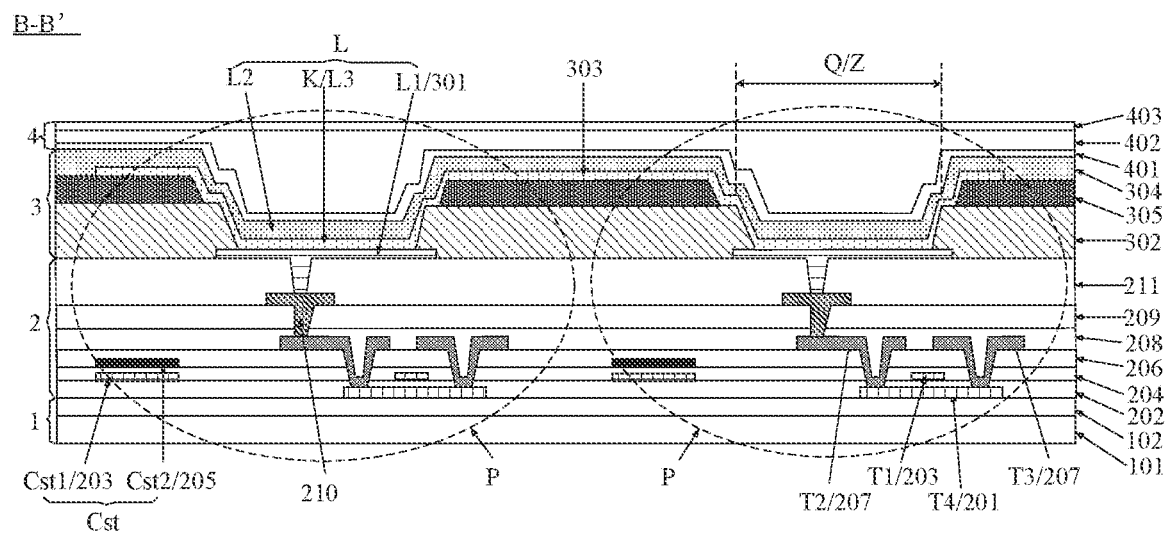
FIG. 4 is a cross-sectional view taken along the section line B-B' shown in FIG. 3.

FIG. 2 is a top view of a display panel 200 provided by some embodiments of the present disclosure. As shown in FIGS. 2 and 4, the display panel 200 includes a substrate 1, and a plurality of sub-pixels P arranged on the substrate 1.

The plurality of sub-pixels P are divided into a plurality of first pixel columns T1 and a plurality of second pixel columns T2, the first pixel columns T1 and the second pixel columns T2 all extend in a first direction X, and the plurality of first pixel columns T1 and the plurality of second pixel columns T2 are arranged alternately in a second direction Y.

The first direction X and the second direction Y intersect. For example, the first direction X and the second direction Y are perpendicular to each other. In the embodiments of the present disclosure, technical solutions obtained by rotating the drawings at a certain angle (e.g., 30 degrees, 45 degrees, or 90 degrees) shall also be included in the protection scope of the present disclosure.

Referring to FIG. 2, the first pixel column T1 includes a plurality of first pixel groups K1 and a plurality of third pixel groups K3 that are alternately arranged in the first direction X. Each first pixel group K1 includes two first sub-pixels P1 arranged sequentially in the first direction X, and each third pixel group K3 includes two third sub-pixels P3 arranged sequentially in the first direction X.

With continuous reference to FIG. 2, the second pixel column T2 includes a plurality of second pixel groups K2 arranged sequentially in the first direction X, and each second pixel group K2 includes two second sub-pixels P2 arranged sequentially in the first direction X.

For example, the first sub-pixel P1, the second sub-pixel P2 and the third sub-pixel P3 emit light of different colors. The color of light emitted by a single sub-pixel P (e.g., the first sub-pixel P1, the second sub-pixel P2 or the third sub-pixel P3) may be one of blue, green, red and white.

Figure 3:
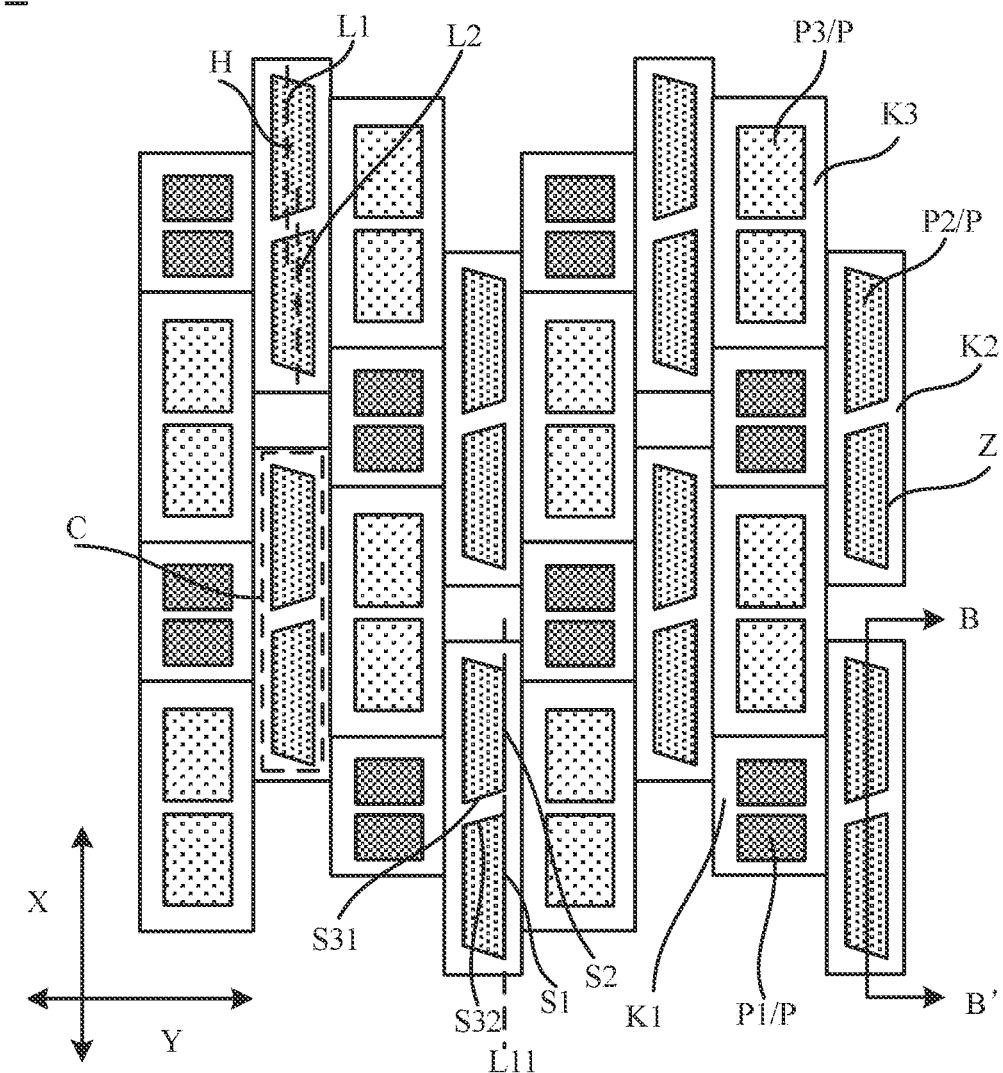
FIG. 3 is a structural diagram corresponding to the region A shown in FIG. 2.

In addition, as shown in FIG. 3, in each second pixel group K2, geometric centers H of light-emitting regions Z of two second sub-pixels P2 are located on two straight lines L1 and L2 extending in the first direction X. That is, there is an included angle between a connection line of the geometric centers H of the light-emitting regions Z of the two second sub-pixels P2 and the first direction X.

For example, as shown in FIG. 3, in the two second sub-pixels P2 of each second pixel group K2, a geometric center H of a light-emitting region Z of one second sub-pixel P2 is located on a first straight line L1 extending in the first direction X, and a geometric center H of a light-emitting region Z of the other second sub-pixel P2 is located on a second straight line L2 extending in the first direction X. The first straight line L1 and the second straight line L2 are arranged in parallel in the second direction Y.

It will be noted that, "the light-emitting region Z" refers to an effective light-emitting region of each sub-pixel P, and "the geometric center H of the light-emitting region Z" refers to a geometric center of a figure corresponding to an orthogonal projection of the light-emitting region Z on the substrate 1. For example, in a case where a plane figure corresponding to the light-emitting region Z is a triangle, the geometric center H of the light-emitting region Z is the geometric center of the triangle. A position of the geometric center H of the light-emitting region Z is substantially consistent with that of a light-emitting luminance center of the sub-pixel P corresponding to the light-emitting region Z.

In the display panel 200 provided by some embodiments of the present disclosure, the geometric centers H of the light-emitting regions Z of the two second sub-pixels P2 in each second pixel group K2 are respectively located on two straight lines extending in the first direction X, that is, there is an included angle between the connection line of the geometric centers H of the light-emitting regions Z of the two second sub-pixels P2 and the first direction X. In this way, in a process of the sub-pixel P emitting light, luminance centers of the light-emitting regions of the two second sub-pixels P2 in the same second pixel group K2 are staggered from each other in the second direction Y, so that uniformity of the light-emitting luminance of the light-emitting regions in the second pixel group K2 may be improved, and thus uniformity of the light-emitting luminance of the display panel 200 may be improved.

For example, as shown in FIG. 4, the display panel 200 includes driving circuits 2, a light-emitting device layer 3 and an encapsulation layer 4 that are stacked on the substrate 1.

The substrate 1 may be of a single-layer structure or a multi-layer structure. For example, the substrate 1 may include a polyimide layer 101 and a buffer layer 102 that are stacked sequentially. For another example, the substrate 1 may include a plurality of polyimide layers 101 and a plurality of buffer layers 102 that are stacked sequentially. A material of the buffer layer 102 may include silicon nitride and/or silicon oxide, so as to achieve an effect of blocking moisture, oxygen and alkaline ions.

The driving circuit 2 includes an active layer 201, a first gate insulating layer 202, a first gate conductive layer 203, a second gate insulating layer 204, a second gate conductive layer 205, an interlayer dielectric layer 206, a second source-drain conductive layer 207, a passivation layer 208, a second planarization layer 209, a first source-drain conductive layer 210 and a first planarization layer 211 that are sequentially stacked on the substrate 1.

Optionally, the source-drain conductive layer may have only one layer (e.g., only the first source-drain conductive layer 210 or only the second source-drain conductive layer 207), and accordingly, the planarization layer may have only one layer (e.g., only the first planarization layer 211 or only the second planarization layer 209).

The driving circuit 2 is provided with a plurality of thin film transistors TFT and a plurality of capacitor structures Cst therein. For example, only two thin film transistors TFT and two corresponding capacitor structures Cst are shown in FIG. 4.

For example, the thin film transistor includes a gate T1, a source T2, a drain T3 and an active layer pattern T4. The gate T1 is located in the first gate conductive layer 203, the source T2 and the drain T3 are located in the second source-drain conductive layer 207, and the active layer pattern T4 is located in the active layer 201.

For example, the capacitor structure Cst includes a first electrode plate Cst1 and a second electrode plate Cst2. The first electrode plate Cst1 is located in the first gate conductive layer 203, and the second electrode plate Cst2 is located in the second gate conductive layer 205.

In exemplary embodiments, the light-emitting device layer 3 includes a first electrode layer 301, a pixel defining layer 302, a light-emitting functional layer 303 and a second electrode layer 304 that are sequentially arranged on the driving circuits 2. The light-emitting device layer 3 is provided with a plurality of light-emitting devices L therein. The light-emitting device L includes a first electrode L1 located in the first electrode layer 301, a second electrode L2 located in the second electrode layer 304, and a light-emitting layer L3 located in the light-emitting functional layer 303.

For example, the light-emitting layer L3 may include a light-emitting pattern K. In some other embodiments, in addition to the light-emitting pattern K, the light-emitting layer L3 further includes one or more of an electron transport layer (ETL), an electron injection layer (EIL), a hole transport layer (HTL) and a hole injection layer (HIL).

For example, the pixel defining layer 302 is provided with a plurality of openings Q therein. At least part of the light-emitting pattern K is located in the opening Q. Light generated by the sub-pixel P is shone to the outside through the opening Q. Therefore, "the light-emitting region" also refers to a region of each sub-pixel P corresponding to an opening Q in the pixel defining layer 302. Thus, the geometric center H of the light-emitting region Z may be equivalent to that of a plane figure of the opening Q in the pixel defining layer 302. An area of the plane figure of the opening Q is an area of the light-emitting region of the light emitted by the sub-pixel P.

For example, a support layer 305 may further be provided between the pixel defining layer 302 and the second electrode layer 304. The support layer 305 may support a protective film layer, thereby preventing contact between the protective film layer and the first electrode layer 301 or between the protective film layer and other wires, which may cause the first electrode layer 301 or other wires to be broken.

In exemplary embodiments, the encapsulation layer 4 includes a first encapsulation layer 401, a second encapsulation layer 402 and a third encapsulation layer 403 that are sequentially stacked on the light-emitting device layer 3.

In some embodiments, the second sub-pixel P2 is capable of emitting green light.

In the light-emitting process of the display panel 200, compared with red light and blue light, a proportion of a light-emitting intensity of the green light is larger, and its proportion may be up to 50% or more. Therefore, in a case where the green light is too concentrated, the display effect of the display panel 200 will be affected.

In the foregoing embodiments, the geometric centers H of the light-emitting regions Z of the two second sub-pixels P2 in the same second pixel group K2 are respectively located on two straight lines extending in the first direction X. In addition, the second sub-pixels P2 can emit green light. That is, the luminance centers of the light-emitting regions of the green light in the second pixel group K2 are located on the two straight lines extending in the first direction X, so that the luminance centers of the light-emitting regions of the green light in the second pixel group K2 are staggered from each other in the second direction Y, which makes the green light in the second pixel group K2 uniform. As a result, the light-emitting uniformity of the green light, which accounts for a large proportion in the display panel 200, may be improved, and thus the display effect of the display device 100 may be effectively improved.

The first sub-pixel P1 is capable of emitting one of the red light or the blue light, and the third sub-pixel P3 is capable of emitting the other of the red light or the blue light. For example, the first sub-pixel P1 can emit the red light, and the third sub-pixel P3 can emit the blue light. Alternatively, the first sub-pixel P1 can emit the blue light, and the third sub-pixel P3 can emit the red light.

It will be noted that, the color of the light emitted by the first sub-pixel P1, the color of the light emitted by the second sub-pixel P2, and the color of the light emitted by the third sub-pixel P3 are not limited to red, green and blue. For example, they may emit white light, which is not limited in the present disclosure.

Figure 5:
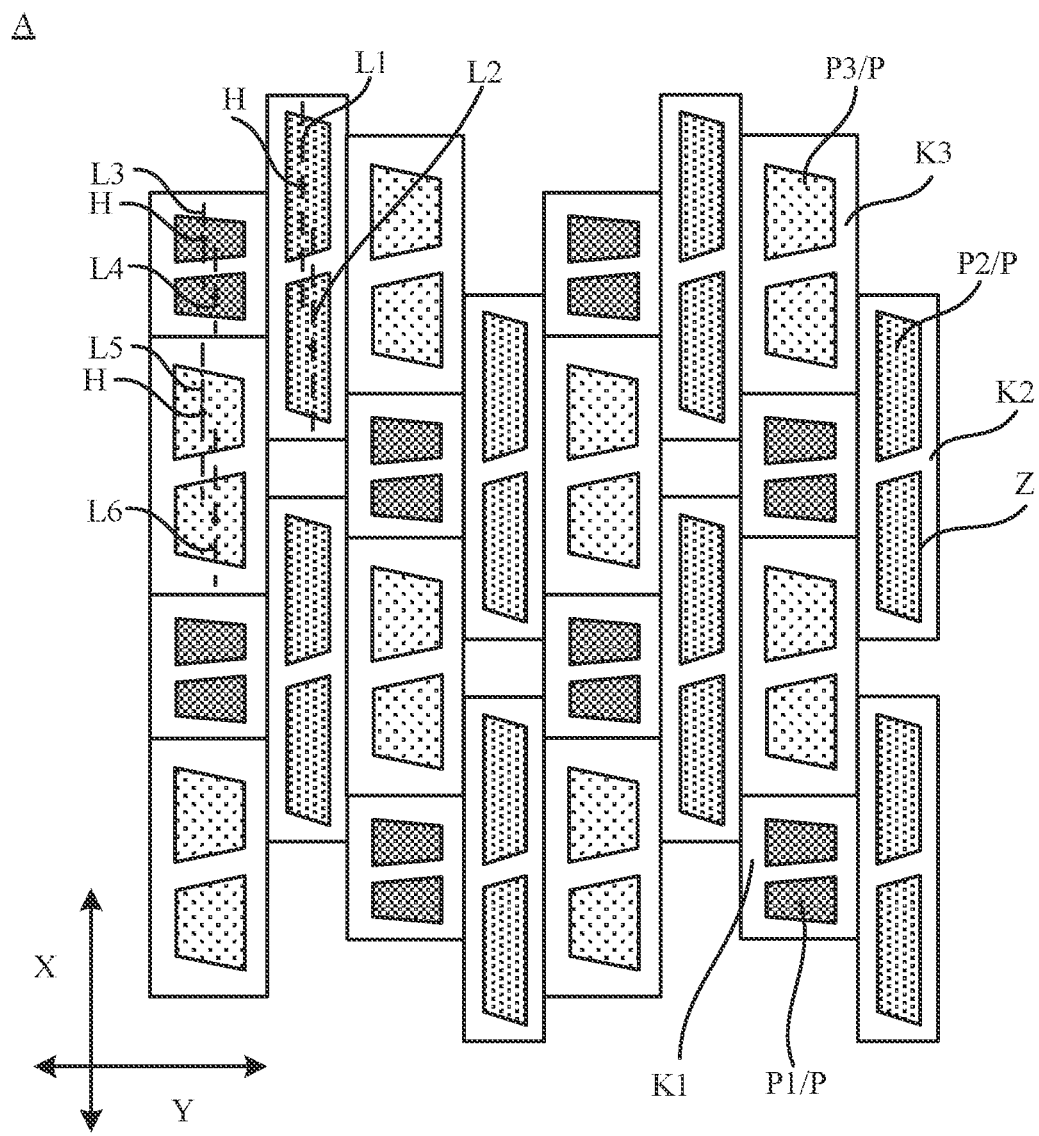
FIG. 5 is another structural diagram corresponding to the region A shown in FIG. 2.

As shown in FIG. 5, in some embodiments, geometric centers H of light-emitting regions of two first sub-pixels P1 are respectively located on two straight lines (L3 and L4) extending in the first direction X. The two first sub-pixels P1 refer to two first sub-pixels P1 located in the same first pixel group K1. For example, as shown in FIG. 5, in the two first sub-pixels P1 located in the same first pixel group K1, a geometric center H of a light-emitting region of one first sub-pixel P1 is located on a third straight line L3 extending in the first direction X, and a geometric center H of a light-emitting region of the other first sub-pixel P1 is located on a fourth straight line L4 extending in the first direction X. The third straight line L3 and the fourth straight line L4 are arranged in parallel in the second direction Y.

In the foregoing embodiment, in each first pixel group K1, the geometric centers H of the light-emitting regions Z of the two first sub-pixels P1 are respectively located on two straight lines extending in the first direction X, that is, there is an included angle between a connection line of the geometric centers H of the light-emitting regions Z of the two first sub-pixels P1 and the first direction X. In this way, in the process of the sub-pixel P emitting light, luminance centers of the light-emitting regions of the two first sub-pixels P1 in the same first pixel group K1 are staggered from each other in the second direction Y, so that uniformity of the light-emitting luminance of the light-emitting regions in the first pixel group K1 may be improved, and thus the uniformity of the light-emitting luminance of the display panel 200 may be improved.

As shown in FIG. 5, in some embodiments, geometric centers H of light-emitting regions of two third sub-pixels P3 are respectively located on two straight lines (L5 and L6) extending in the first direction X. The two third sub-pixels P3 refer to two third sub-pixels P3 located in the same third pixel group K3. For example, as shown in FIG. 5, in the two third sub-pixels P3 located in the same third pixel group K3, a geometric center H of a light-emitting region of one third sub-pixel P3 is located on a fifth straight line L5 extending in the first direction X, and a geometric center H of a light-emitting region of another third sub-pixel P3 is located on a sixth straight line L6 extending in the first direction X. The fifth straight line L5 and the sixth straight line L6 are arranged in parallel in the second direction Y.

In the foregoing embodiment, in each third pixel group K3, the geometric centers H of the light-emitting regions Z of the two third sub-pixels P3 are respectively located on two straight lines extending in the first direction X, that is, there is an included angle between a connection line of the geometric centers H of the light-emitting regions Z of the two third sub-pixels P3 and the first direction X. In this way, in the process of the sub-pixel P emitting light, luminance centers of the light-emitting regions of the two third sub-pixels P3 in the same third pixel group K3 are staggered from each other in the second direction Y, so that uniformity of the light-emitting luminance of the light-emitting regions in the third pixel group K3 may be improved, and thus the uniformity of the light-emitting luminance of the display panel 200 is improved.

For example, geometric centers H of light-emitting regions Z of two sub-pixels P that can emit the red light in the same pixel group are respectively located on two straight lines extending in the first direction X. For example, the first sub-pixel P1 emits the red light, and the geometric centers H of the light-emitting regions Z of the two first sub-pixels P1 in the same first pixel group K1 are respectively located on the two straight lines extending in the first direction X.

In the foregoing embodiment, the geometric centers H of the light-emitting regions Z of the two sub-pixels P that can emit the red light in the same pixel group are respectively located on the two straight lines extending in the first direction X, that is, the luminance centers of the light-emitting regions of the red light in the pixel group are located on the two straight lines extending in the first direction X. In this way, the luminance centers of the light-emitting regions of the red light in the pixel group are staggered from each other in the second direction Y, so that the red light in the second pixel group K2 is emitted uniformly. As a result, the light-emitting uniformity of the red light in the display panel 200 may be improved, and thus the display effect of the display device 100 may be effectively improved.

For example, geometric centers H of light-emitting regions Z of two sub-pixels P that can emit the blue light in the same pixel group are respectively located on two straight lines extending in the first direction X. For example, the third sub-pixel P3 emits the blue light, and the geometric centers H of the light-emitting regions Z of the two third sub-pixels P3 in the same third pixel group K3 are respectively located on the two straight lines extending in the first direction X.

In the foregoing embodiment, the geometric centers H of the light-emitting regions Z of the two sub-pixels P that can emit the blue light in the same pixel group are respectively located on the two straight lines extending in the first direction X, that is, the luminance centers of the light-emitting regions of the blue light in the pixel group are located on the two straight lines extending in the first direction X. In this way, the luminance centers of the light-emitting regions of the blue light in the pixel group are staggered from each other in the second direction Y, so that the blue light in the second pixel group K2 is emitted uniformly. As a result, the light-emitting uniformity of the blue light in the display panel 200 may be improved, and thus the display effect of the display device 100 may be effectively improved.

For example, the geometric centers H of the light-emitting regions Z of the two sub-pixels P that can emit the blue light in the same pixel group are respectively located on two straight lines extending in the first direction X, the geometric centers H of the light-emitting regions Z of the two sub-pixels P that can emit the red light in the same pixel group are respectively located on another two straight lines extending in the first direction X, and the geometric centers H of the light-emitting regions Z of the two sub-pixels P that can emit the green light in the same pixel group are respectively located on yet another two straight lines extending in the first direction X. As a result, the light-emitting uniformity of the blue, red and green light in the display panel 200 may be improved, and thus the display effect of the display device 100 may be further improved.

As shown in FIG. 5, in some embodiments, an area of the light-emitting region Z of the third sub-pixel P3 is greater than an area of the light-emitting region Z of the first sub-pixel P1, and the area of the light-emitting region Z of the third sub-pixel P3 is greater than an area of the light-emitting region Z of the second sub-pixel P2. For example, as shown in FIG. 5, in a case where the first sub-pixel P1 can emit the red light, the second sub-pixel P2 can emit the green light, and the third sub-pixel P3 can emit the blue light, the area of the light-emitting region Z of the third sub-pixel P3 is greater than the area of the light-emitting region Z of the first sub-pixel P1, and is greater than the area of the light-emitting region Z of the second sub-pixel P2. That is, the area of the light-emitting region Z of the sub-pixel P that can emit the blue light is greater than the area of the light-emitting region Z of the sub-pixel P that can emit the red light, and is greater than the area of the light-emitting region Z of the sub-pixel P that can emit the green light.

In a case where the first sub-pixel P1, the second sub-pixel P2 and the third sub-pixel P3 have the same light-emitting luminance, an operating voltage of the third sub-pixel P3 is high, and the light-emitting device L operates in a high-voltage condition, which may cause the service life of the material of the light-emitting layer L3 in the light-emitting device L to be short. Therefore, the area of the light-emitting region Z of the third sub-pixel P3 is set to be large, so that the service life of the material of the light-emitting layer L3 in the light-emitting device L may be prolonged.

Figure 6:
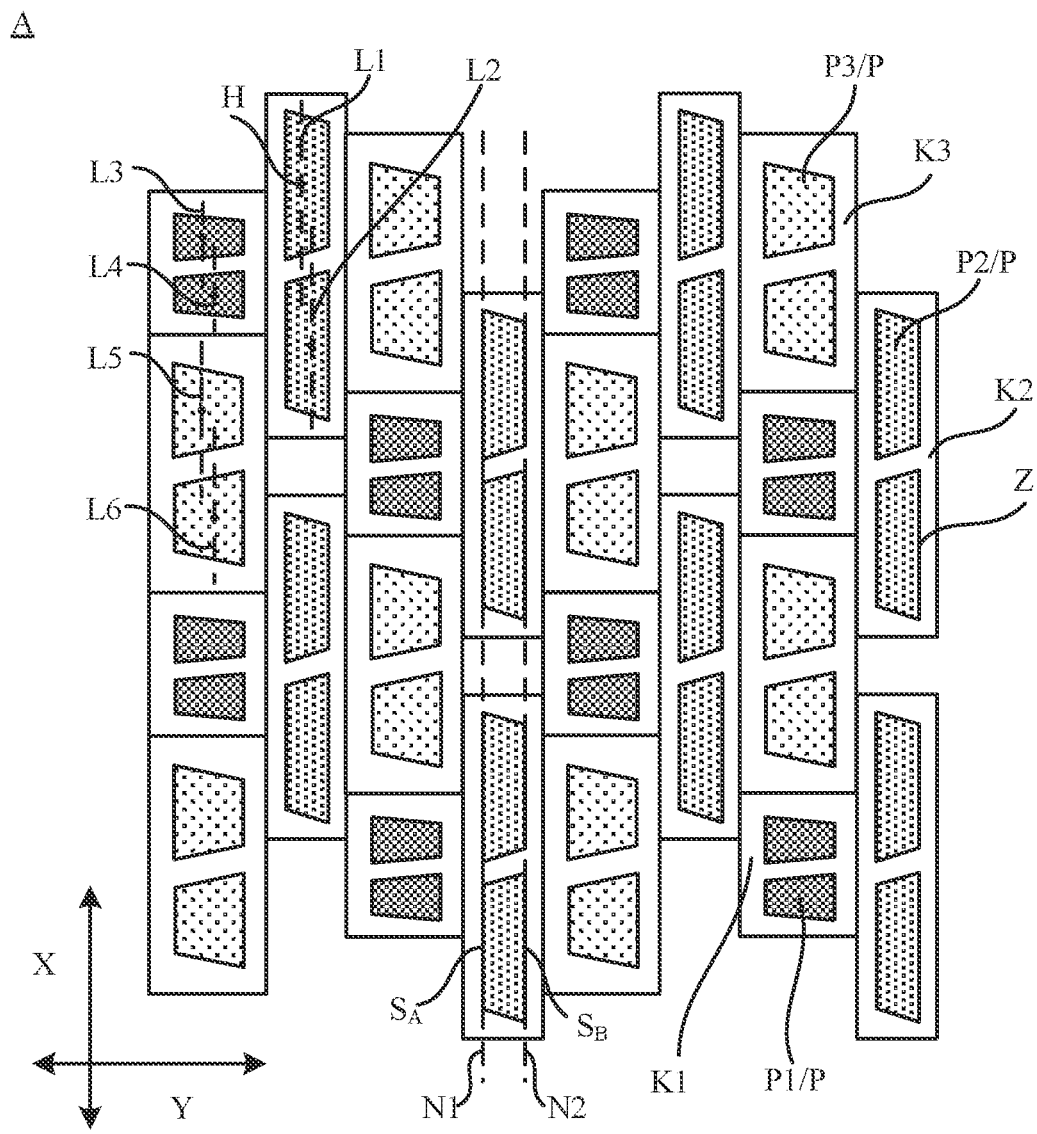
FIG. 6 is yet another structural diagram corresponding to the region A shown in FIG. 2.
Figure 9:
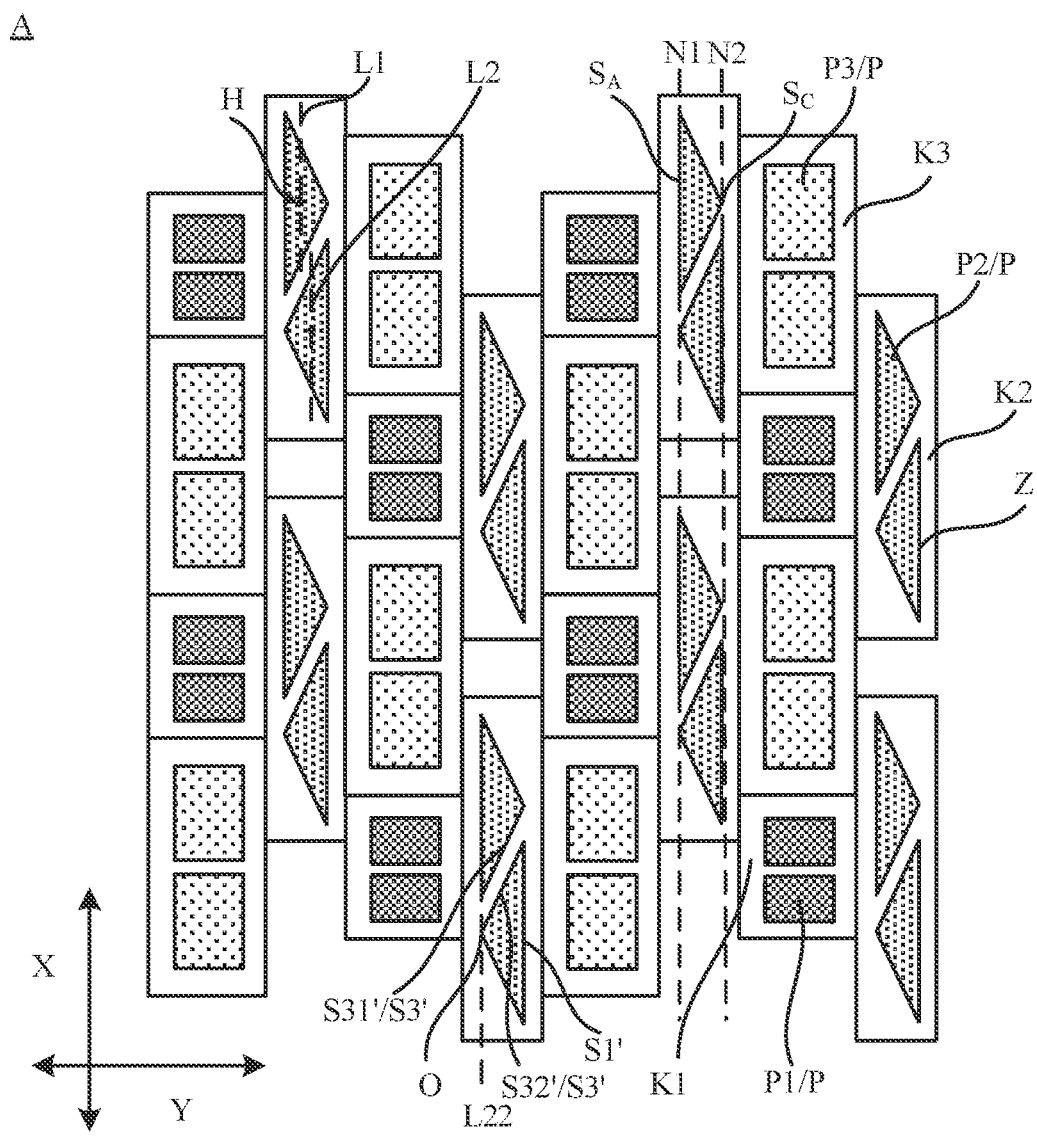
FIG. 9 is yet another structural diagram corresponding to the region A shown in FIG. 2.

As shown in FIGS. 6 and 9, in some embodiments, in the same second pixel column T2, light-emitting regions Z of a plurality of second sub-pixels P2 are located between a first reference line N1 and a second reference line N2. At least one side (e.g., a side SA shown in FIG. 6) or at least one point (e.g., a point Sc shown in FIG. 9) of the light-emitting region Z of the second sub-pixel P2 is located on the first reference line N1, and at least another side (e.g., a side Se shown in FIG. 6) or at least another point (this case not shown in figures) of the light-emitting region Z of the second sub-pixel P2 is located on the second reference line N2. The first reference line N1 and the second reference line N2 both extend in the first direction X and are arranged in parallel in the second direction Y.

It can be understood that, the largest widths of the light-emitting regions Z of the sub-pixels P in the same second pixel column T2 in the second direction Y are all substantially equal, and the largest widths are substantially equal to a distance between the first reference line N1 and the second reference line N2 in the second direction Y.

For example, in the same first pixel column T1, light-emitting regions Z of a plurality of first sub-pixels P1 and light-emitting regions Z of a plurality of third sub-pixels P3 are all located between two reference lines extending in the first direction X and arranged in parallel in the second direction Y. That is, the largest widths of the light-emitting regions Z of the sub-pixels P in the same first pixel column T1 in the second direction Y are all substantially equal, and are substantially equal to the distance between the two reference lines in the second direction Y.

Figure 7:
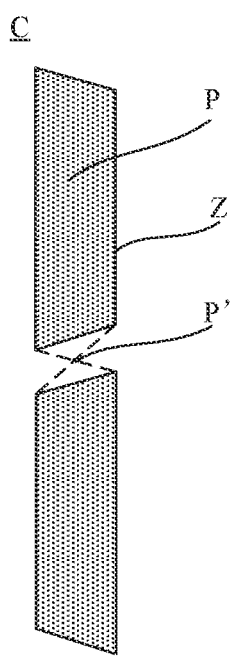
FIG. 7 is a structural diagram corresponding to the region C shown in FIG. 3.

As shown in FIG. 7, in some embodiments, the light-emitting regions Z of the two second sub-pixels P2 located in the same second pixel group K2 have substantially the same shape, and the two light-emitting regions Z are arranged centrosymmetrically.

It will be noted that, referring to FIG. 7, the light-emitting regions Z of the two second sub-pixels P2 located in the same second pixel group K2 are symmetrical to each other with a symmetry point P' as a center of symmetry. That is, a light-emitting region Z of one second sub-pixel P2 will coincide with a light-emitting region of the other second sub-pixel P2 after rotating by 180 degrees around the symmetry point P'.

Through the above arrangement, the light-emitting regions Z of the two second sub-pixels P2 located in the same second pixel group K2 have substantially the same shape, so that the areas of the light-emitting regions Z of the two second sub-pixels P2 in the same second pixel group K2 are substantially equal. In addition, the two light-emitting regions Z are arranged centrosymmetrically, so that the arrangement of the light-emitting regions Z of the two second sub-pixels P2 in the same second pixel group K2 may be compact, thereby improving the pixel per inch (PPI) of the display device 100.

In exemplary embodiments, the light-emitting regions Z of the two first sub-pixels P1 located in the same first pixel group K1 have substantially the same shape, and the two light-emitting regions Z are arranged centrosymmetrically. In this way, the arrangement of the light-emitting regions Z of the two first sub-pixels P1 in the same first pixel group K1 is compact, thereby improving the PPI of the display device 100.

In exemplary embodiments, the light-emitting regions Z of the two third sub-pixels P3 located in the same third pixel group K3 have substantially the same shape, and the two light-emitting regions Z are arranged centrosymmetrically. In this way, the arrangement of the light-emitting regions Z of the two third sub-pixels P3 in the same third pixel group K3 is compact, thereby improving the PPI of the display device 100.

In some embodiments, as shown in FIGS. 3, 5 to 6, 8 to 10, and 12 to 16, in the two second sub-pixels P2 located in the same second pixel group K2, a side (e.g. a leg S3 shown in FIG. 8) of a light-emitting region Z of one second sub-pixel P2 is adjacent to and parallel to a side (another leg S3 shown in FIG. 8) of a light-emitting region Z of the other second sub-pixel P2.

For example, the light-emitting regions Z of the second sub-pixels P2 are each in a shape of a trapezoid, a triangle, or a polygon with at least five sides. For example, the light-emitting region Z of the second sub-pixel P2 is in a shape of an isosceles trapezoid, a right trapezoid, a sector, an isosceles triangle, a pentagon, or a hexagon.

For example, as shown in FIG. 9, in a case where the light-emitting regions Z are each in the shape of the triangle, a leg of one light-emitting region Z is adjacent to and parallel to a leg of another light-emitting region Z. Sides, proximate to each other, of the two adjacent second sub-pixels P2 are arranged in a parallel manner. Therefore, a distance between two adjacent second sub-pixels P2 in each second pixel group K2 is controlled to be substantially equal. As a result, a space between the two adjacent second sub-pixels P2 may be maximally utilized, and the aperture ratio of the display device 100 may be prevented from being reduced due to the difference of the shapes of the light-emitting regions Z of the second sub-pixels P2.

Figure 11:
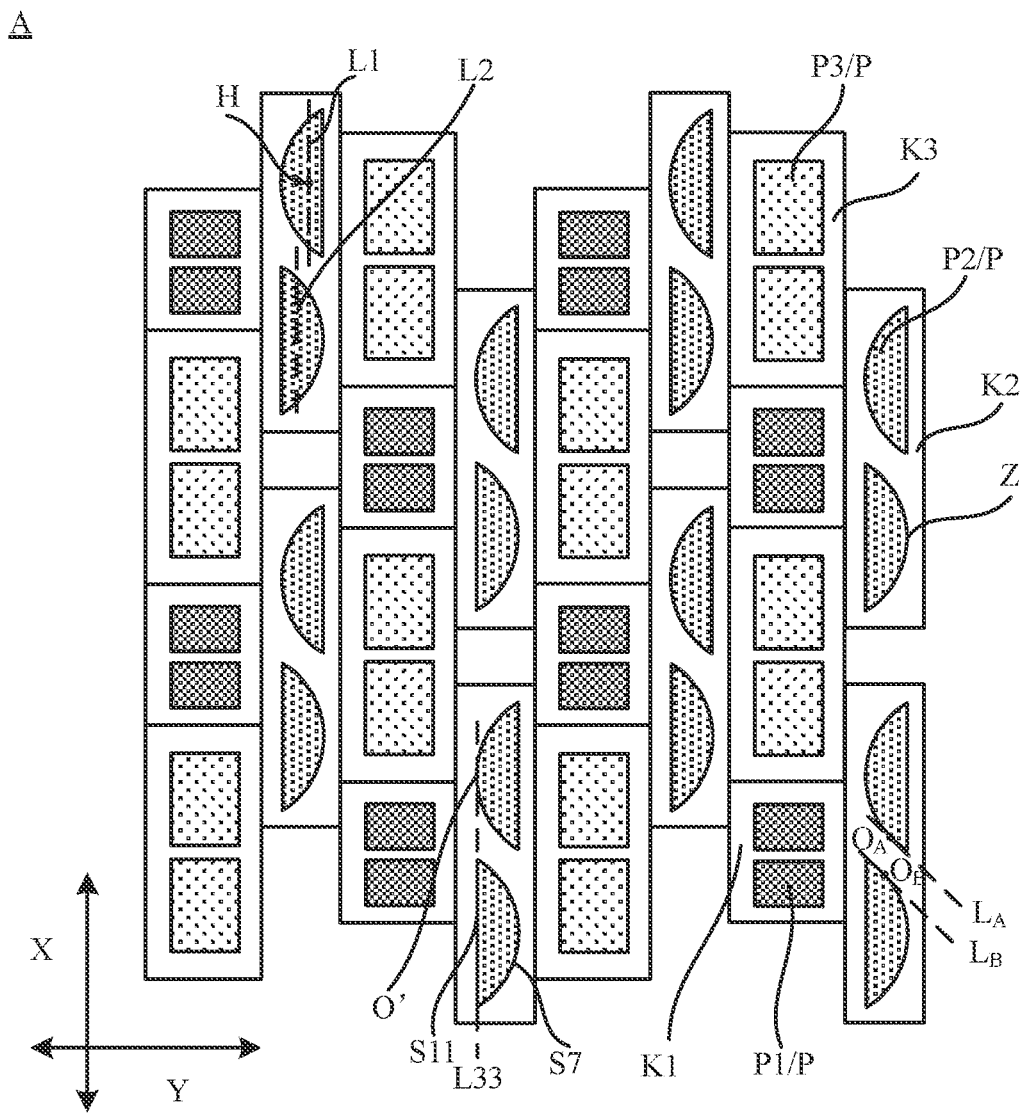
FIG. 11 is yet another structural diagram corresponding to the region A shown in FIG. 2.

In some embodiments, as shown in FIG. 11, in the two second sub-pixels P2 located in the same second pixel group K2, a portion of a border of a light-emitting region Z of one second sub-pixel P2 is adjacent to a portion of a border of a light-emitting region Z of the other second sub-pixel P2, and in the two adjacent portions of the borders, a tangent $L_A$ of at least one point $O_A$ on one portion and a tangent $L_B$ of at least one point $O_B$ on the other portion are parallel to each other.

As shown in FIG. 11, for example, the light-emitting regions Z of the second sub-pixels P2 are each in a shape of a bow. In the two second sub-pixels P2, at least a portion of a curved side of a light-emitting region Z of one second sub-pixel P2 is adjacent to at least a portion of a curved side of a light-emitting region Z of the other second sub-pixel P2, and at least one tangent $L_A$ of the curved side of the light-emitting region Z of the one second sub-pixel P2 is parallel to at least one tangent $L_B$ of the curved side of the light-emitting region Z of the other second sub-pixel P2. In this way, the distance between the two adjacent second sub-pixels P2 in each second pixel group K2 may also be controlled to be substantially equal. As a result, the space between the two adjacent second sub-pixels P2 may be maximally utilized, and the aperture ratio of the display device 100 may be prevented from being reduced due to the difference of the shapes of the light-emitting regions Z of the second sub-pixels P2.

According to the foregoing, the light-emitting regions Z of the second sub-pixels P2 are each in the shape of the trapezoid, the bow, the triangle, or the polygon with at least five sides. For example, the light-emitting region Z of the second sub-pixel P2 is in the shape of the isosceles trapezoid, the right trapezoid, the sector, the isosceles triangle, the pentagon, or the hexagon. However, the light-emitting region Z of the second sub-pixel P2 cannot be a regular polygon such as a regular triangle, a regular pentagon, or a hexagon, since the geometric center of the regular polygon is in the middle of the figure, and distances between the geometric center and each side of the regular polygon are equal. In a case where the light-emitting regions Z of the two second sub-pixels P have substantially the same shape and are arranged centrosymmetrically, the geometric centers H of the light-emitting regions Z of the two second sub-pixels P2 cannot be located on two straight lines in the first direction X, thereby causing a problem that light emitted by the two adjacent second sub-pixels P2 is too concentrated.

It will be noted that, the shape of the light-emitting region Z of the second sub-pixel P2 is not limited to the above, and shapes that can achieve an effect that the geometric centers H of the light-emitting regions Z of the two sub-pixels in the same pixel group are located on two straight lines in the first direction X are all included in the protection scope of the embodiments of the present disclosure.

Figure 8:
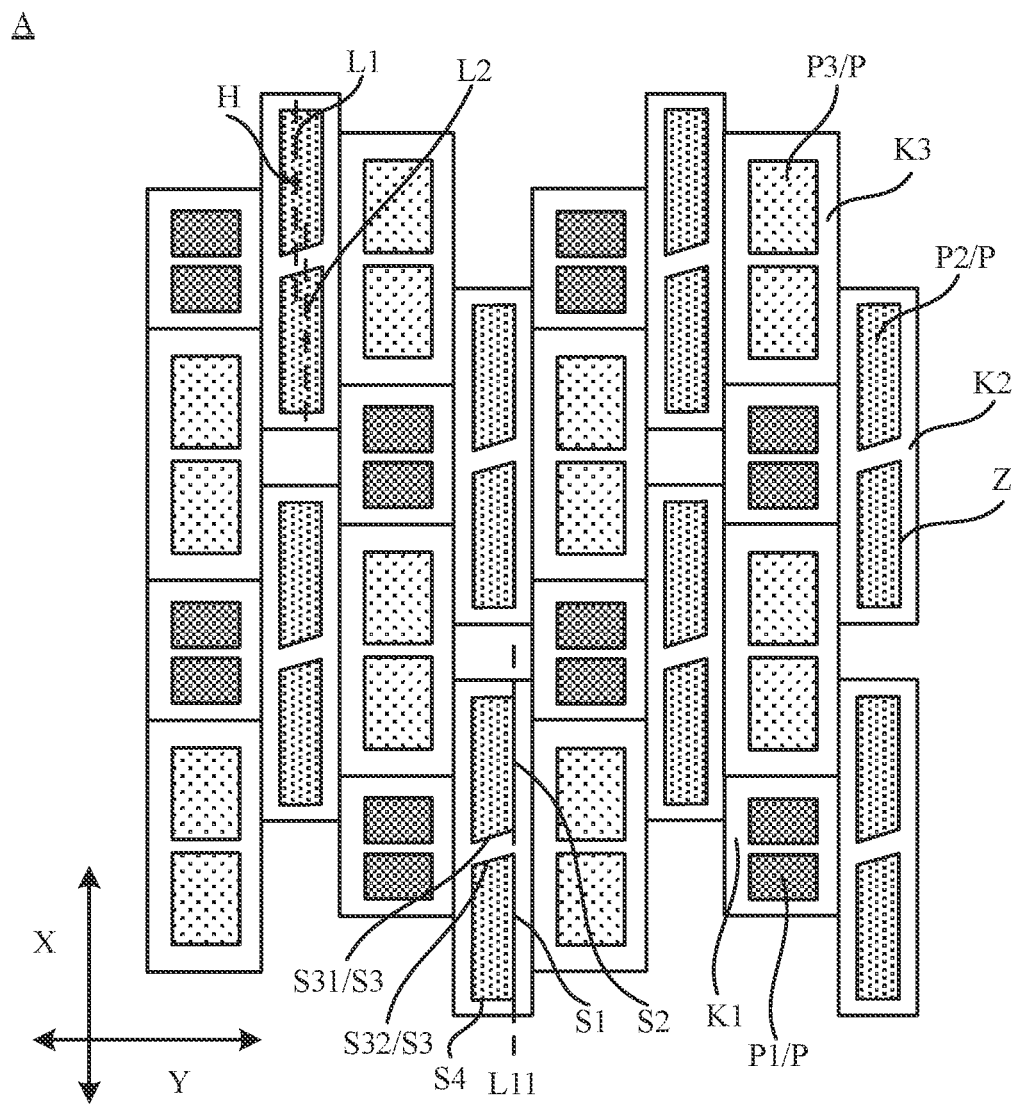
FIG. 8 is yet another structural diagram corresponding to the region A shown in FIG. 2.

As shown in FIGS. 3 and 8, in some embodiments, the light-emitting regions Z of the second sub-pixels P2 are each in the shape of the trapezoid. The trapezoid includes a bottom base (the bottom base S1 shown in FIG. 3) and a top base (the top base S2 shown in FIG. 3), and the bottom base S1 and the top base S2 of the light-emitting region Z both extend in the first direction X. In the two second sub-pixels P2 located in the same second pixel group K2, a bottom base S1 of a light-emitting region Z of one second sub-pixel P2 and a top base S2 of a light-emitting region Z of the other second sub-pixel P2 are located on a same straight line L11 extending in the first direction X. That is, in the two second sub-pixels P2 located in the same second pixel group K2, the bottom bases S1 of the light-emitting regions Z of the two second sub-pixels P2 are located on two different straight lines extending in the first direction X; similarly, the top bases S2 of the light-emitting regions Z of the two second sub-pixels P2 are located on two different straight lines extending in the first direction X.

It can be understood that, the geometric center of the trapezoid is closer to the bottom base S1 of the trapezoid than to the top base S2 of the trapezoid. With the above arrangement, in the two second sub-pixels P2 located in the same second pixel group K2, the bottom base S1 of the light-emitting region Z of the one second sub-pixel P2 and the top base S2 of the light-emitting region Z of the another second sub-pixel P2 are located on the same straight line extending in the first direction X. Therefore, it may ensure that in a case where the width (the size in the second direction Y) of the second pixel column T2 does not change, the geometric centers H of the light-emitting regions Z of the two second sub-pixels P2 are respectively located on two different straight lines extending in the first direction X. That is, the luminance centers of the light-emitting regions of the two second sub-pixels P2 are staggered from each other in the second direction Y. As a result, the uniformity of the light-emitting luminance of the light-emitting regions in the second pixel group K2 may be improved, and thus the uniformity of the light-emitting luminance of the display panel 200 may be improved.

As shown in FIG. 3, for example, the light-emitting regions Z of the second sub-pixels P2 are each in the shape of the isosceles trapezoid. In the two second sub-pixels P2 located in the same second pixel group K2, a leg (e.g., a leg S31) of the light-emitting region Z of the one second sub-pixel P2 is adjacent to and parallel to a leg (e.g., a leg S32) of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

As shown in FIG. 8, for example, the light-emitting regions Z of the second sub-pixels P2 are each in the shape of the right trapezoid. The light-emitting region Z includes the bottom base S1, the top base S2, a leg S3 and a right-angled side S4 perpendicular to the bottom base and the top base. In the two second sub-pixels P2 located in the same second pixel group K2, a leg (e.g., the leg S31) of the light-emitting region Z of the one second sub-pixel P2 is adjacent to and parallel to a leg (e.g., the leg S32) of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

Figure 10:
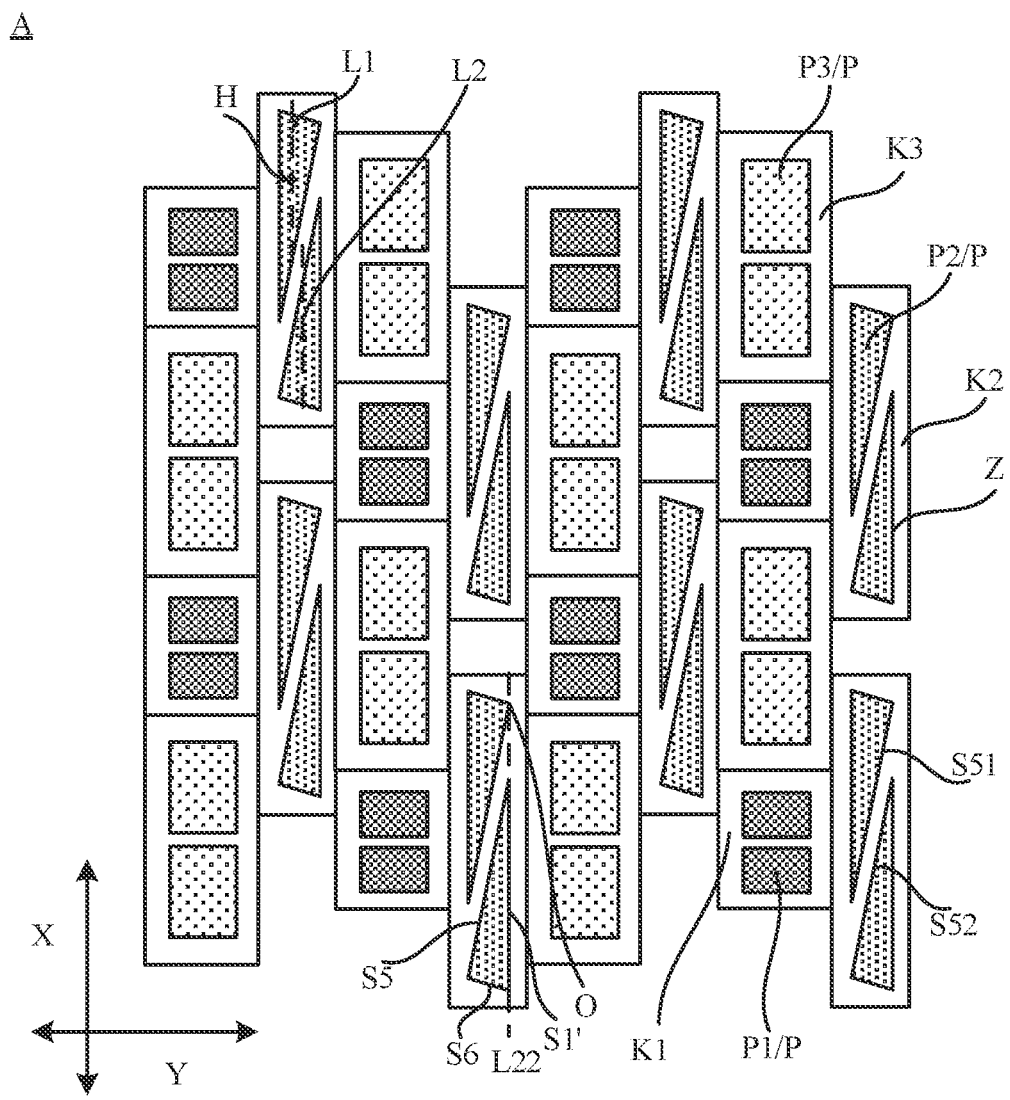
FIG. 10 is yet another structural diagram corresponding to the region A shown in FIG. 2.

As shown in FIGS. 9 and 10, in some embodiments, the light-emitting regions Z of the second sub-pixels P2 are each in the shape of the triangle. The triangle includes a base side (e.g., the base side S1' shown in FIG. 9) and a vertex (e.g., a vertex O shown in FIG. 9) opposite to the base side S1'. A side of the light-emitting region Z extends in the first direction X, and the side extending in the first direction X is the base side S1'. In the two second sub-pixels P2 located in the same second pixel group K2, a vertex O corresponding to a base side S1' of the light-emitting region Z of the one second sub-pixel P2 and a base side S1' of the light-emitting region Z of the other second sub-pixel P2 are located on the same straight line L22 extending in the first direction X. That is, in the two second sub-pixels P2 located in the same second pixel group K2, the base sides S1' of the light-emitting regions Z of the two second sub-pixels P2 are located on two different straight lines extending in the first direction X; similarly, the vertexes O of the light-emitting regions Z of the two second sub-pixels P2 are also located on two different straight lines extending in the first direction X.

It can be understood that, the geometric center of the triangle (except an equilateral triangle) is closer to a side (i.e., the base side S1') opposite to the vertex O than to the vertex O. With the above arrangement, in the two second sub-pixels P2 located in the same second pixel group K2, the base side S1' of the light-emitting region Z of the one second sub-pixel P2 and the vertex O of the light-emitting region Z of the other second sub-pixel P2 are located on the same straight line extending in the first direction X. Therefore, it may ensure that in the case where the width (the size in the second direction Y) of the second pixel column T2 does not change, the geometric centers H of the light-emitting regions Z of the two second sub-pixels P2 are respectively located on two different straight lines extending in the first direction X. That is, the luminance centers of the light-emitting regions of the two second sub-pixels P2 are staggered from each other in the second direction Y. As a result, the uniformity of the light-emitting luminance of the light-emitting regions in the second pixel group K2 may be improved, and thus the uniformity of the light-emitting luminance of the display panel 200 may be improved.

As shown in FIG. 9, for example, the light-emitting regions Z of the second sub-pixels P2 are each in the shape of the isosceles triangle. The light-emitting region Z includes the base side S1' and two legs S3', and an intersection of the two legs S3' is the vertex O. The base side S1' of the light-emitting region Z extends in the first direction X. In the two second sub-pixels P2 located in the same second pixel group K2, a leg S31' of the light-emitting region Z of the one second sub-pixel P2 is adjacent to and parallel to a leg S32' of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

As shown in FIG. 10, for example, the light-emitting regions Z of the second sub-pixels P2 are each in the shape of the right triangle. The light-emitting region Z includes the base side S1', a long right-angled side S5 and a short right-angled side S6, and an intersection of the long right-angled side S5 and the short right-angled side S6 is the vertex O. The base side S1' of the light-emitting region Z extends in the first direction X. In the two second sub-pixels P2 located in the same second pixel group K2, the vertex O corresponding to the base side S1' of the light-emitting region Z of the one second sub-pixel P2 and the base side S1' of the light-emitting region Z of the other second sub-pixel P2 are located on the same straight line extending in the first direction X, and a long right-angled side S51 of the light-emitting region Z of the one second sub-pixel P2 is adjacent to and parallel to a long right-angled side S52 of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

As shown in FIG. 11, in some embodiments, the light-emitting regions Z of the second sub-pixels P2 are each in the shape of the bow. The light-emitting region Z includes a base side S11 and a curved side S7 connected to the base side S11, and the base side S11 extends in the first direction X. In the two second sub-pixels P2 located in the same second pixel group K2, the base side S11 of the light-emitting region Z of the one second sub-pixel P2 and a point O' farthest from the base side S11 on the curved side S7 of the light-emitting region Z of the other second sub-pixel P2 are located on the same straight line L33 extending in the first direction X. That is, in the two second sub-pixels P2 located in the same second pixel group K2, the base side S11 of the light-emitting region Z of the one second sub-pixel P2 and the base side S11 of the light-emitting region Z of the other second sub-pixel P2 are located on two different straight lines extending in the first direction X; similarly, the point O' farthest from the base side on the curved side S7 of the light-emitting region Z of the one second sub-pixel P2 and the point O' farthest from the base side on the curved side S7 of the light-emitting region Z of the other second sub-pixel P2 are also located on the two different straight lines extending in the first direction X.

It can be understood that, the geometric center of the bow is closer to the base side S11 of the bow. With the above arrangement, in the two second sub-pixels P2 located in the same second pixel group K2, the base side S11 of the light-emitting region Z of the one second sub-pixel P2 and the point O' farthest from the base side S11 on the curved side S7 of the light-emitting region Z of the other second sub-pixel P2 are located on the same straight line extending in the first direction X. Therefore, it may ensure that in the case where the width (the size in the second direction Y) of the second pixel column T2 does not change, the geometric centers H of the light-emitting regions Z of the two second sub-pixels P2 are respectively located on two different straight lines extending in the first direction X. That is, the luminance centers of the light-emitting regions of the two second sub-pixels P2 are staggered from each other in the second direction Y. As a result, the uniformity of the light-emitting luminance of the light-emitting regions in the second pixel group K2 may be improved, and thus the uniformity of the light-emitting luminance of the display panel 200 may be improved.

For example, the light-emitting regions Z of the second sub-pixels P2 are each in the shape of the sector (e.g., a semicircle). The geometric center of the sector is closer to the base side of the sector. In the two sub-pixels located in the same second pixel group K2, the base side of the light-emitting region Z of the one sub-pixel and the base side of the light-emitting region Z of the other sub-pixel are located on two different straight lines extending in the first direction X, and similarly, the point farthest from the base side on the curved side of the light-emitting region Z of the one second sub-pixel P2 and the point farthest from the base side on the curved side of the light-emitting region Z of the other second sub-pixel P2 are located on the two different straight lines extending in the first direction X. As a result, it may ensure that in the case where the width (the size in the second direction Y) of the second pixel column T2 does not change, the geometric centers H of the light-emitting regions Z of the two second sub-pixels P2 are located on two different straight lines extending in the first direction X. That is, the luminance centers of the light-emitting regions Z of the two second sub-pixels P2 are staggered from each other in the second direction Y. Therefore, the uniformity of the light-emitting luminance of the light-emitting regions in the second pixel group K2 may be improved, and thus the uniformity of the light-emitting luminance of the display panel 200 may be improved.

Figure 12:
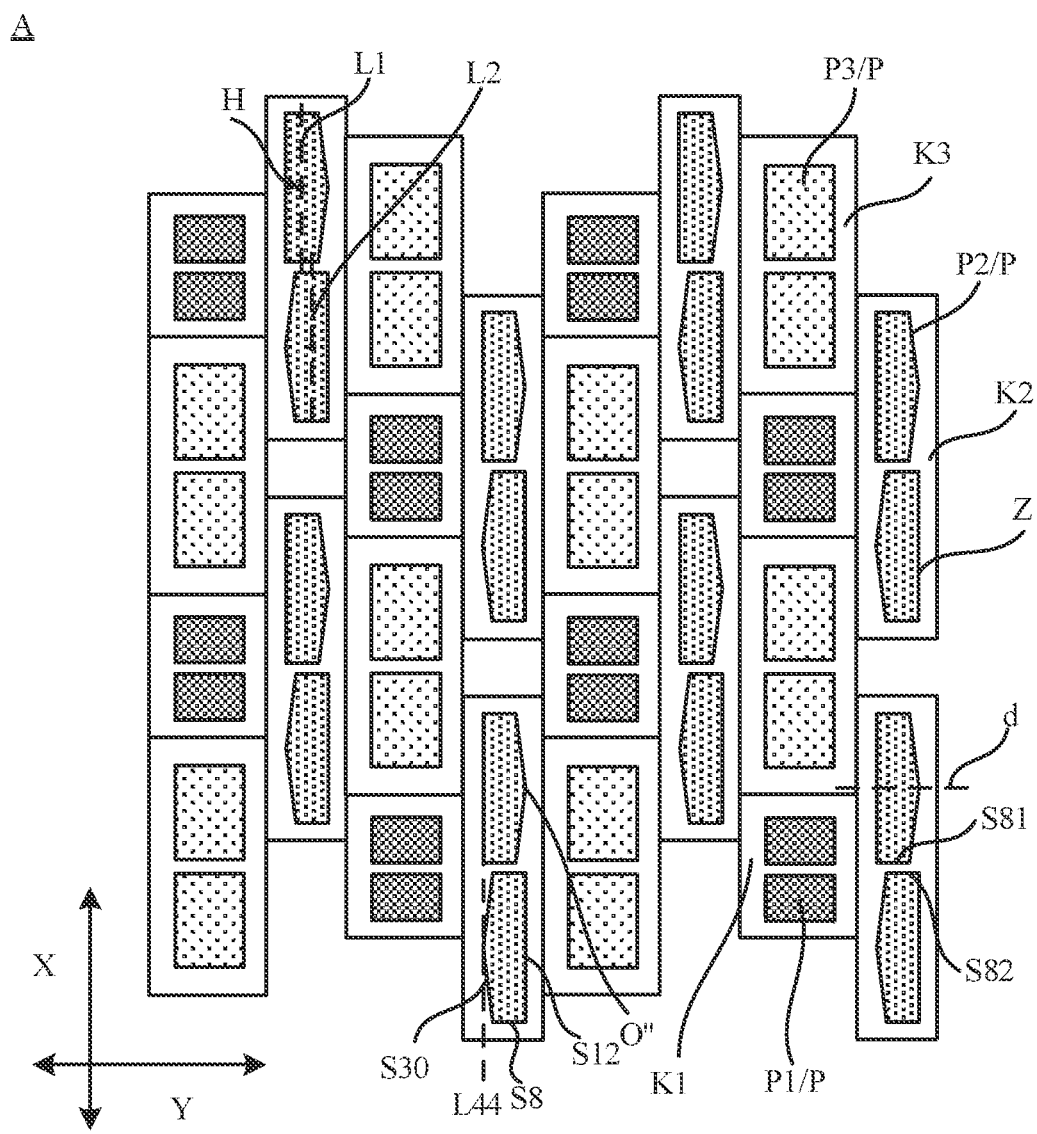
FIG. 12 is yet another structural diagram corresponding to the region A shown in FIG. 2.
Figure 13:
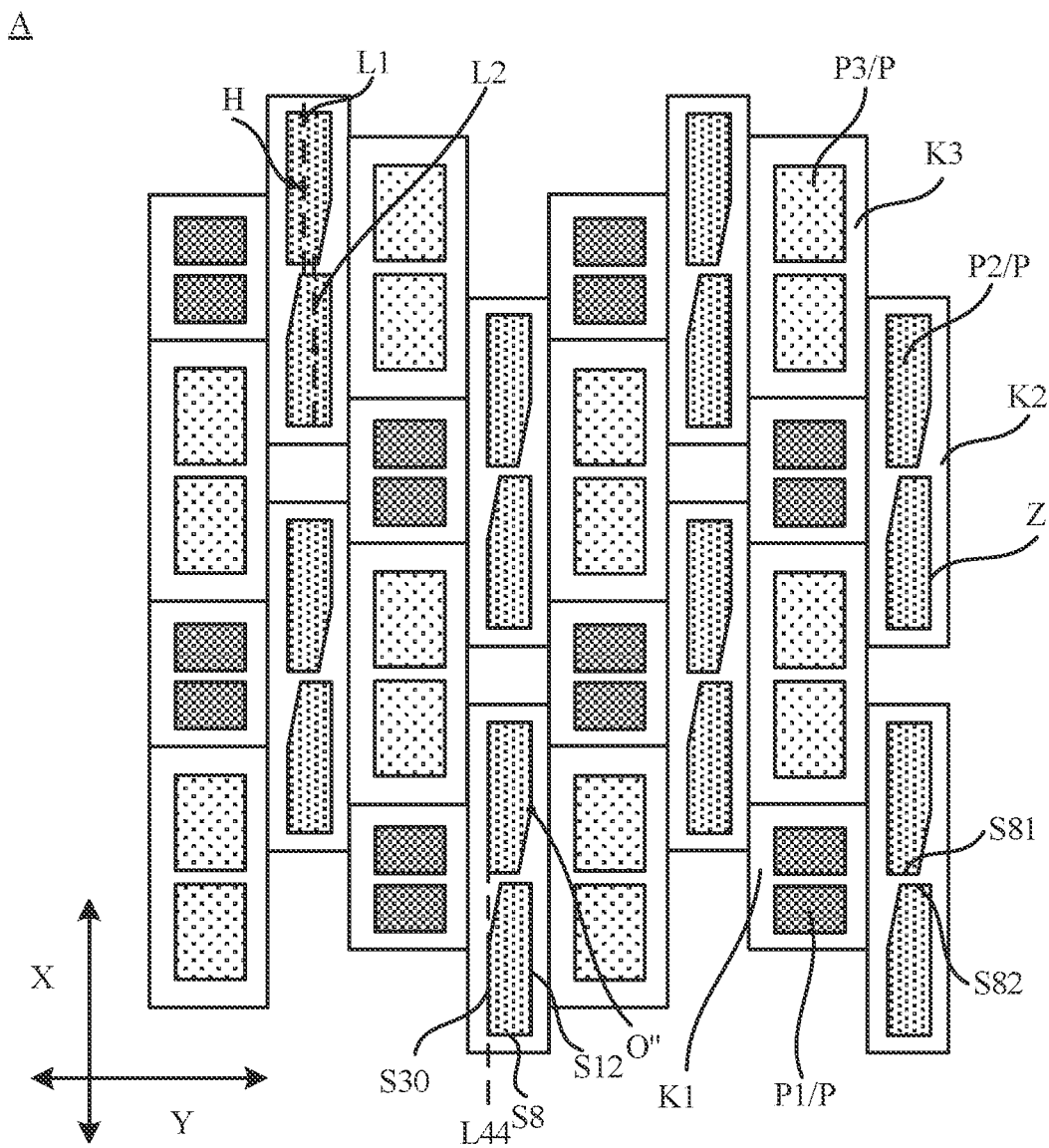
FIG. 13 is yet another structural diagram corresponding to the region A shown in FIG. 2.

As shown in FIGS. 12 and 13, in some embodiments, the light-emitting regions Z of the second sub-pixels P2 are each in the shape of the pentagon. The light-emitting region Z includes a base side S12, two right-angled sides S8 connected to both ends of the base side S12 and perpendicular to the base side S12, and two legs S30 respectively connected to the two right-angled sides S8. The base side S12 extends in the first direction X, the two legs S30 are connected to each other, and a connection point thereof is the vertex O". In the two second sub-pixels P2 located in the same second pixel group K2, the base side S12 of the light-emitting region Z of the one second sub-pixel P2 and the vertex O" of the light-emitting region Z of the other second sub-pixel P2 are located on the same straight line L44 extending in the first direction X. That is, in the two second sub-pixels P2 located in the same second pixel group K2, the base side S12 of the light-emitting region Z of the one second sub-pixel P2 and the base side S12 of the light-emitting region Z of the other second sub-pixel P2 are located on two different straight lines extending in the first direction X; similarly, the vertex O" of the light-emitting region Z of the one second sub-pixel P2 and the vertex O" of the light-emitting region Z of the other second sub-pixel P2 are also located on the two different straight lines extending in the first direction X.

It can be understood that, the geometric center of the pentagon (except a regular pentagon) is closer to the base side S12 corresponding to the vertex O" than to the vertex O". With the above arrangement, in the two second sub-pixels P2 located in the same second pixel group K2, the base side S12 of the light-emitting region Z of the one second sub-pixel P2 and the vertex O" of the light-emitting region Z of the other second sub-pixel P2 are located on the same straight line extending in the first direction X. Therefore, it may ensure that in the case where the width (the size in the second direction Y) of the second pixel column T2 does not change, the geometric centers H of the light-emitting regions Z of the two second sub-pixels P2 are respectively located on two different straight lines extending in the first direction X. That is, the luminance centers of the light-emitting regions of the two second sub-pixels P2 are staggered from each other in the second direction Y. As a result, the uniformity of the light-emitting luminance of the light-emitting regions in the second pixel group K2 may be improved, and thus the uniformity of the light-emitting luminance of the display panel 200 may be improved.

A right-angled side S81 of the light-emitting region Z of the one second sub-pixel P2 is adjacent to and parallel to a right-angled side S82 of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

As shown in FIG. 12, for example, the light-emitting regions Z of the second sub-pixels P2 are each in the shape of the pentagon. The two legs S30 of the pentagon have the same lengths, and the two legs S30 are symmetrical with a straight line (e.g., a dashed line d shown in FIG. 12) passing through the vertex O" and extending in the second direction Y. Therefore, the light-emitting region Z of the second sub-pixel P2 has a regular shape while the uniformity of the light-emitting luminance of the display panel 200 is improved.

As shown in FIG. 13, for example, the light-emitting regions Z of the second sub-pixels P2 are each in the shape of the pentagon. One of the two legs S30 of the pentagon is perpendicular to a right-angled side S8. Therefore, while the uniformity of the light-emitting luminance of the display panel 200 is improved, the area of the light-emitting region Z increases to the greatest extent, and the aperture ratio of the display panel 200 may be improved.

Figure 14:
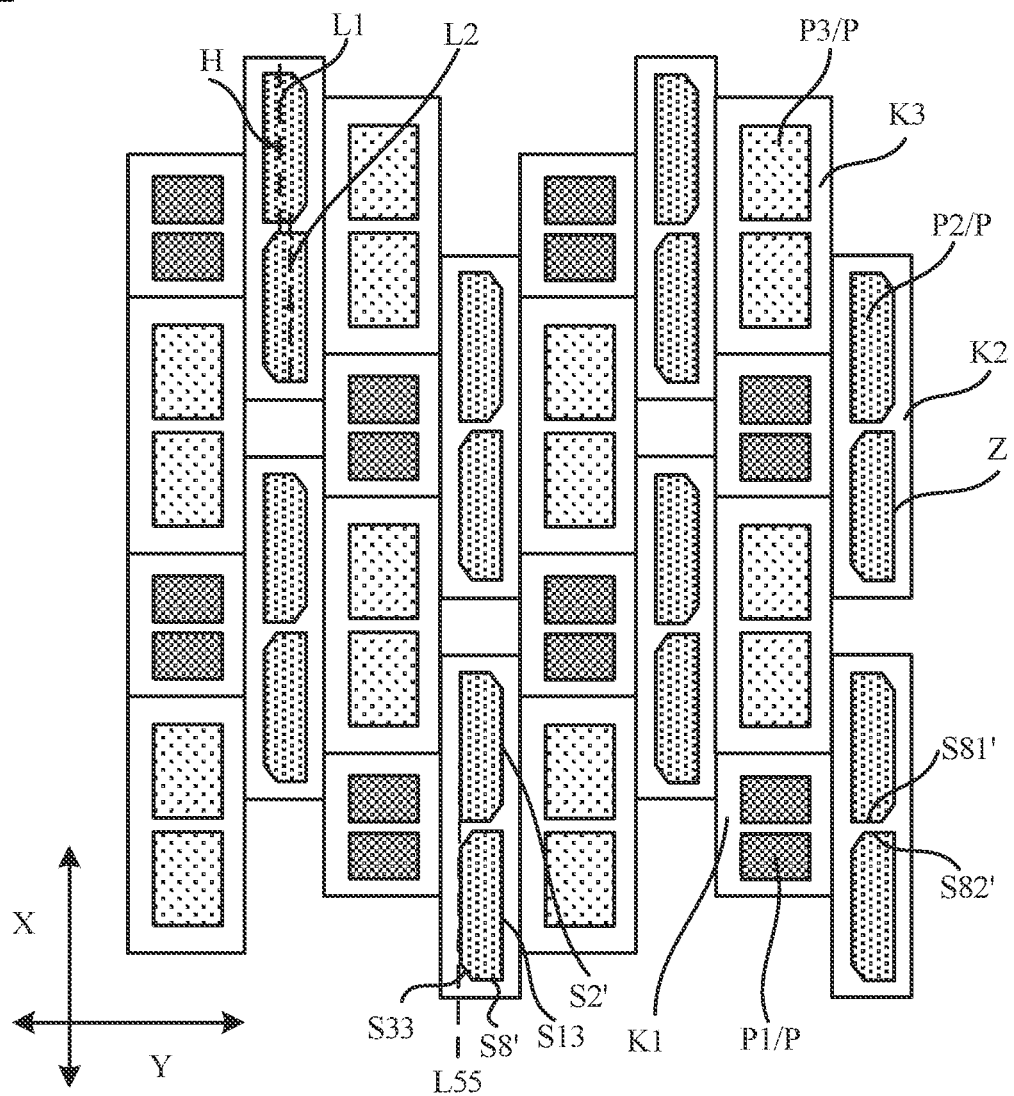
FIG. 14 is yet another structural diagram corresponding to the region A shown in FIG. 2.

As shown in FIG. 14, in some embodiments, the light-emitting regions Z of the second sub-pixels P2 are each in the shape of the hexagon. The light-emitting region Z includes a base side S13, two right-angled sides S8' connected to both ends of the base side S13 and perpendicular to the base side S13, two legs S33 respectively connected to the two right-angled sides S8', and a top side S2' connected to the two legs S33. The base side S13 and the top side S2' extend in the first direction X. In the two second sub-pixels P2 located in the same second pixel group K2, the base side S13 of the light-emitting region Z of the one second sub-pixel P2 and the top side S2' of the light-emitting region Z of the other second sub-pixel P2 are located on the same straight line L55 extending in the first direction X. That is, in the two second sub-pixels P2 located in the same second pixel group K2, the base side S13 of the light-emitting region Z of the one second sub-pixel P2 and the base side S13 of the light-emitting region Z of the other second sub-pixel P2 are located on two different straight lines extending in the first direction X; similarly, the top side S2' of the light-emitting region Z of the one second sub-pixels P2 and the top side S2' of the light-emitting region Z of the other second sub-pixels P2 are located on the two different straight lines extending in the first direction X.

It can be understood that, the geometric center of the hexagon (except a regular hexagon) is closer to the base side S13 of the hexagon than to the top side S2' thereof. With the above arrangement, in the two second sub-pixels P2 located in the same second pixel group K2, the base side S13 of the light-emitting region Z of the one second sub-pixel P2 and the top side S2' of the light-emitting region Z of the other second sub-pixel P2 are located on the same straight line extending in the first direction X. Therefore, it may ensure that in the case where the width (the size in the second direction Y) of the second pixel column T2 does not change, the geometric centers H of the light-emitting regions Z of the two second sub-pixels P2 are respectively located on two different straight lines extending in the first direction X. That is, the luminance centers of the light-emitting regions of the two second sub-pixels P2 are staggered from each other in the second direction Y. As a result, the uniformity of the light-emitting luminance of the light-emitting regions in the second pixel group K2 may be improved, and thus the uniformity of the light-emitting luminance of the display panel 200 may be improved.

A right-angled side S81' of the light-emitting region Z of the one second sub-pixel P2 is adjacent to and parallel to a right-angled side S82' of the light-emitting region Z of the other second sub-pixel P2. Therefore, the distance between the two adjacent second sub-pixels P2 in each second pixel group K2 is controlled to be substantially equal while the uniformity of the light-emitting luminance of the display panel 200 is improved. In this way, the aperture ratio of the display device 100 may be prevented from being reduced due to the difference of the shapes of the light-emitting regions Z of the second sub-pixels P2.

For example, the light-emitting regions Z of the second sub-pixels P2 are each in the shape of the hexagon, and the two legs of the hexagon may be arcs. Therefore, while the uniformity of the light-emitting luminance of the display panel 200 is improved, the area of the light-emitting region Z increases to the greatest extent, and the aperture ratio of the display panel 200 may be improved.

In addition, in some embodiments, the light-emitting regions Z of at least one of the first sub-pixels P1 and the third sub-pixels P3 are each in a shape of a trapezoid, a bow, a triangle, or a polygon with at least five sides. For example, the light-emitting regions Z of the first sub-pixels P1 and the light-emitting regions Z of the third sub-pixels P3 are each in a shape of a right-angled trapezoid, an isosceles triangle, a pentagon with two right angles, or a hexagon with two right angles. By designing the shapes of the light-emitting regions of the first sub-pixels P1 and the third sub-pixels P3, the light of the color emitted by the first sub-pixel P1 and the light of the color emitted by the third sub-pixel P3 may be uniformly distributed. As a result, the uniformity of the light-emitting luminance of the entire display panel 200 may be improved, and thus the display effect of the display device 100 may be enhanced.

Figure 15:
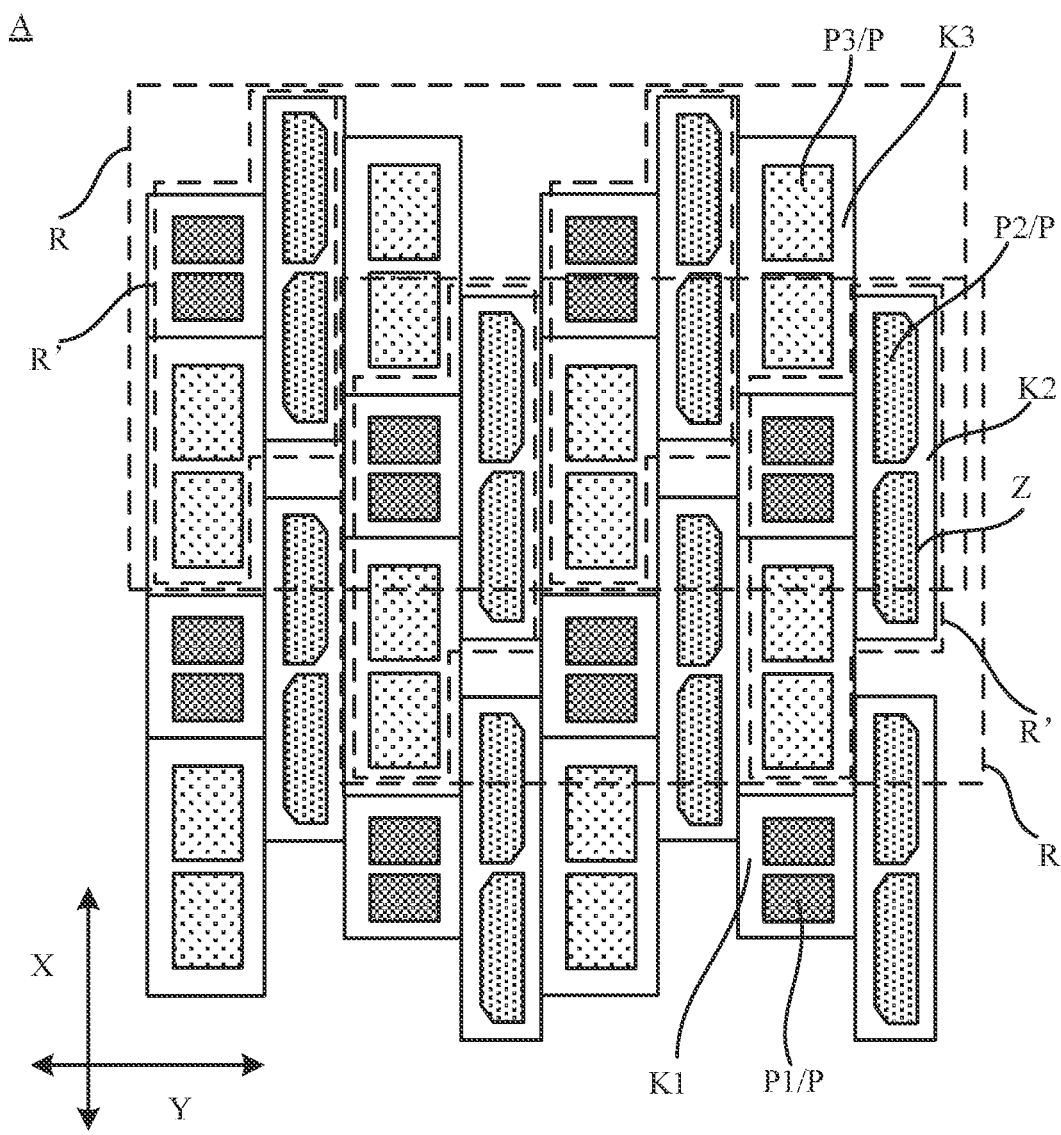
FIG. 15 is yet another structural diagram corresponding to the region A shown in FIG. 2.

As shown in FIG. 15, in some embodiments, the plurality of sub-pixels P are divided into a plurality of pixel rows R, the pixel rows R extend in the second direction Y, and the plurality of pixel rows R are arranged in parallel in the first direction X. The pixel row R includes a plurality of pixel units R' arranged sequentially in the second direction Y, and the pixel unit R' includes a first pixel group K1, a second pixel group K2 and a third pixel group K3. The pixel units R' of two adjacent pixel rows R are arranged in a staggered manner in the second direction Y.

The pixel units R' are arranged in a staggered manner, so that there are opposite areas between the second pixel group K2 and the first pixel group K1 adjacent thereto between the second pixel group K2 and the third pixel group K3 adjacent thereto. As a result, the sub-pixels P that emit the light of different colors are compactly arranged, thereby improving the aperture ratio of the display device 100.

Figure 16:
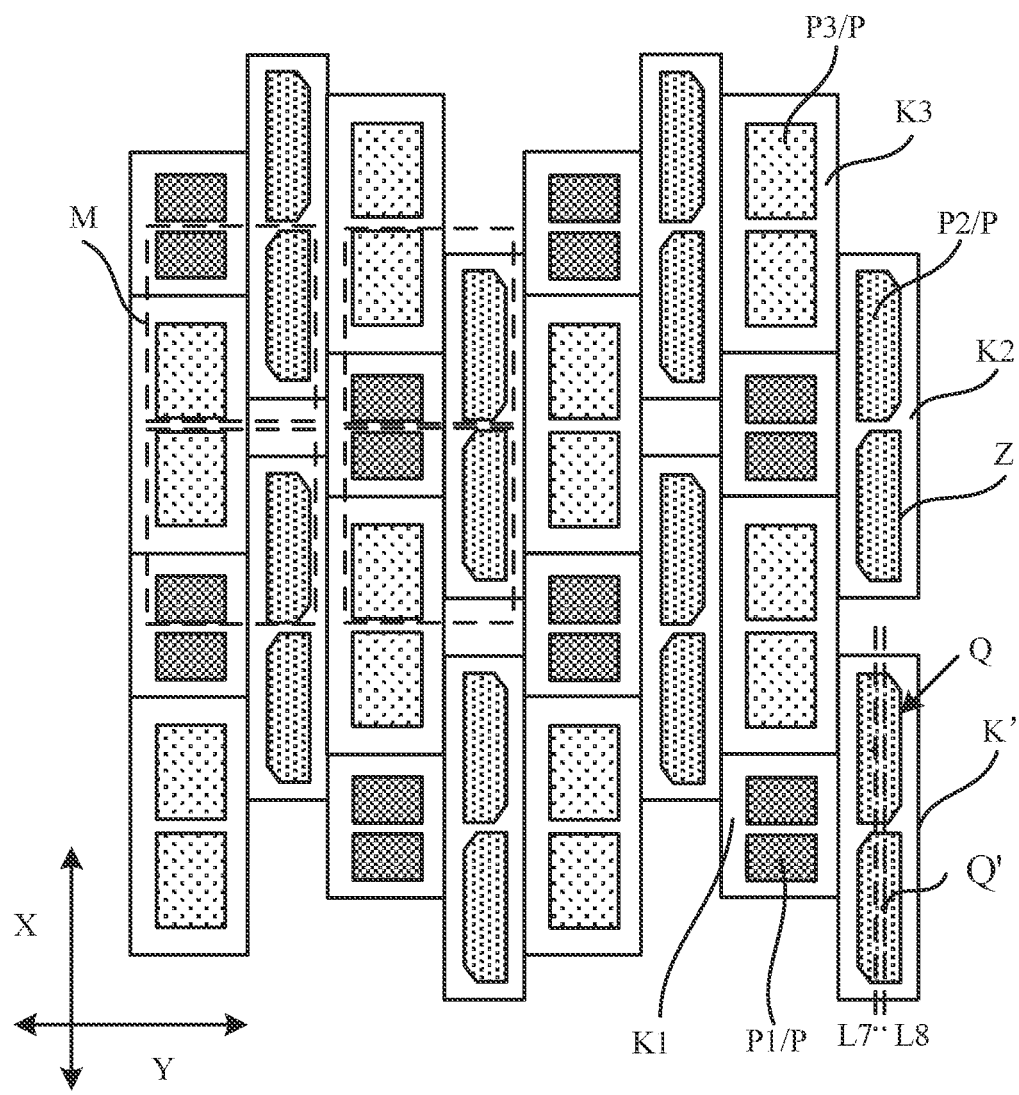
FIG. 16 is yet another structural diagram corresponding to the region A shown in FIG. 2.

As shown in FIG. 16, in some embodiments, the display panel 200 includes a plurality of pixels M, and at least one pixel M includes a first sub-pixel P1, a second sub-pixel P2 and a third sub-pixel P3. The first sub-pixel P1 and the third sub-pixel P3 that are adjacent to each other in a first pixel column T1, and a second sub-pixel P2 in a second pixel column T2 adjacent to the first pixel column T1 constitute a single pixel M. The plurality of pixels M are arranged in the first direction X and the second direction Y, and the plurality of pixels M are compactly arranged, which may improve the aperture ratio and the PPI of the display device 100.

As shown in FIG. 4, in some embodiments, the display panel 200 further includes the pixel defining layer 302 and the light-emitting layer L3. The pixel defining layer 302 includes the plurality of openings Q, the light-emitting layer L3 includes a plurality of light-emitting patterns K, and two second sub-pixels P2 in a second pixel group K2 share a same light-emitting pattern K. A single light-emitting pattern K corresponds to two openings Q, and at least part of the light-emitting pattern K is located in the two corresponding openings Q.

As shown in FIG. 16, geometric centers Q' of the two openings Q are located on two straight lines L7 and L8 extending in the first direction X. The light-emitting pattern K emits light of a color through the opening Q, and thus the area of the opening Q is the area of the light-emitting region Z. The geometric centers of the two openings Q are located on the two straight lines extending in the first direction X, so that in the process that the two second sub-pixels P2 in the same second pixel group K2 emits the light of the color, light-emitting luminance centers of the light of the color are staggered from each other in the second direction Y. Thus, light emitted by the two second sub-pixels P2 in the second pixel group K2 may be prevented from being concentrated, and the uniformity of the light-emitting luminance of the full screen of the display panel 200 may be improved.

In exemplary embodiments, each sub-pixel (including the first sub-pixel P1, the second sub-pixel P2 and the third sub-pixel P3) includes a light-emitting pattern K, and the light-emitting patterns K of the two sub-pixels in the same pixel group are made of the same material and are disposed as a whole. For example, the light-emitting patterns K corresponding to the two second sub-pixels P2 in the second pixel group K2 are disposed as a whole and can emit light of the same color.

In the process of forming the light-emitting layer L3 of the same color through a patterning process, different openings of a mask are used to form adjacent sub-pixels P, which may cause a gap between light-emitting patterns K of adjacent sub-pixels P due to the process and further reduce the aperture ratio of the display panel 200. In the above embodiments in which the light-emitting patterns K corresponding to the two sub-pixels P in the same pixel group are disposed as the whole, the gap between the light-emitting patterns K of the sub-pixels P emitting the light of the same color may be reduced, an area of the non-light-emitting region may be reduced effectively, and the PPI and the aperture ratio of the display panel 200 may be improved.

It will be noted that, as shown in FIG. 4, the light-emitting pattern K of each sub-pixel P includes an effective portion located in the corresponding opening Q of the pixel defining layer 302, and an edge portion located on the main body (except the opening Q) of the pixel defining layer 302. In the patterning process of forming the light-emitting layer L3, an orthogonal projection of an opening of the mask corresponding to each sub-pixel P on the substrate 1 overlaps with an orthogonal projection of the light-emitting pattern K (an entity consisting of the effective portion and the edge portion) of the sub-pixel P on the substrate 1. For example, as shown in FIG. 16, the orthogonal projection of the light-emitting pattern K of the second sub-pixel P2 on the substrate 1 is the region K'. Similarly, in the patterning process, the orthogonal projection of the opening of the mask on the substrate 1 for forming the light-emitting pattern K of the second sub-pixel P2 is also the region K'.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
    a substrate, and
    a plurality of sub-pixels disposed on the substrate, each sub-pixel having a light-emitting region, wherein
    the plurality of sub-pixels are divided into a plurality of first pixel columns and a plurality of second pixel columns, the plurality of first pixel columns and the plurality of second pixel columns all extend in a first direction, and the plurality of first pixel columns and the plurality of second pixel columns are disposed alternately in a second direction; the first direction and the second direction intersect;
    a first pixel column includes a plurality of first pixel groups and a plurality of third pixel groups that are disposed alternately in the first direction, a first pixel group includes two first sub-pixels disposed sequentially in the first direction in the plurality of sub-pixels, and a third pixel group includes two third sub-pixels disposed sequentially in the first direction in the plurality of sub-pixels;
    a second pixel column includes a plurality of second pixel groups disposed sequentially in the first direction, a second pixel group includes two second sub-pixels disposed sequentially in the first direction in the plurality of sub-pixels, and geometric centers of light-emitting regions of the two second sub-pixels are located on two straight lines extending in the first direction;
    in a same second pixel column, light-emitting regions of a plurality of second sub-pixels are located between a first reference line and a second reference line, at least one side or at least one point of a light-emitting region of a second sub-pixel in the plurality of second sub-pixels is located on the first reference line, and at least another side or at least another point of the light-emitting region of the second sub-pixel in the plurality of second sub-pixels is located on the second reference line; and
    the first reference line and the second reference line both extend in the first direction, and are disposed in parallel in the second direction.

2. The display panel according to claim 1, wherein geometric centers of light-emitting regions of the two first sub-pixels are located on another two straight lines extending in the first direction; and/or
    geometric centers of light-emitting regions of the two third sub-pixels are located on another two straight lines extending in the first direction.

3. The display panel according to claim 1, wherein an area of a light-emitting region of a third sub-pixel is greater than an area of a light-emitting region of a first sub-pixel, and the area of the light-emitting region of the third sub-pixel is greater than an area of a light-emitting region of a second sub-pixel.

4. The display panel according to claim 1, wherein the light-emitting regions of the two second sub-pixels in the second pixel group have substantially a same shape, and the two light-emitting regions are disposed centrosymmetrically.

5. The display panel according to claim 1, wherein in the two second sub-pixels located in the second pixel group, a side of a light-emitting region of one second sub-pixel is adjacent to and parallel to a side of a light-emitting region of another second sub-pixel; or
    in the two second sub-pixels located in the second pixel group, a portion of a border of the light-emitting region of the one second sub-pixel is adjacent to a portion of a border of the light-emitting region of the another second sub-pixel, and in the two adjacent portions of the borders, a tangent of at least one point on one portion and a tangent of at least one point on another portion are parallel to each other.

6. The display panel according to claim 1, wherein the light-emitting regions of the two second sub-pixels are each in a shape of a trapezoid, a bow, a triangle, or a polygon with at least five sides.

7. The display panel according to claim 1, wherein the light-emitting regions of the two second sub-pixels are each in a shape of a trapezoid; a light-emitting region includes a bottom base and a top base, and the bottom base and the top base of the light-emitting region both extend in the first direction; and
    in the two second sub-pixels located in the second pixel group, a bottom base of a light-emitting region of one second sub-pixel and a top base of a light-emitting region of another second sub-pixel are located on a same straight line extending in the first direction.

8. The display panel according to claim 7, wherein the light-emitting regions of the two second sub-pixels are each in a shape of an isosceles trapezoid, and the light-emitting region further includes two legs; and
    in the two second sub-pixels located in the second pixel group, a leg of the light-emitting region of the one second sub-pixel is adjacent to and parallel to a leg of the light-emitting region of the another second sub-pixel.

9. The display panel according to claim 7, wherein the light-emitting regions of the two second sub-pixels are each in a shape of a right trapezoid, and the light-emitting region further includes a leg, and a right-angled side perpendicular to both the bottom base and the top base; and
    in the two second sub-pixels located in the second pixel group, a leg of the light-emitting region of the one second sub-pixel is adjacent to and parallel to a leg of the light-emitting region of the another second sub-pixel.

10. The display panel according to claim 1, wherein the light-emitting regions of the two second sub-pixels are each in a shape of a triangle, and a light-emitting region includes a base side extending in the first direction; and in the two second sub-pixels located in the second pixel group, a vertex corresponding to a base side of a light-emitting region of one second sub-pixel and a base side of a light-emitting region of another second sub-pixel are located on a same straight line extending in the first direction.

11. The display panel according to claim 10, wherein the light-emitting regions of the two second sub-pixels are each in a shape of an isosceles triangle, and the light-emitting region further includes two legs; and in the two second sub-pixels located in the second pixel group, a leg of the light-emitting region of the one second sub-pixel is adjacent to and parallel to a leg of the light-emitting region of the another second sub-pixel.

12. The display panel according to claim 10, wherein the light-emitting regions of the two second sub-pixels are each in a shape of a right triangle, and the light-emitting region further includes a long right-angled side and a short right-angled side;

in the two second sub-pixels located in the second pixel group, a long right-angled side of the light-emitting region of the one second sub-pixel is adjacent to and parallel to a long right-angled side of the light-emitting region of the another second sub-pixel.

13. The display panel according to claim 1, wherein the light-emitting regions of the two second sub-pixels are each in a shape of a bow, a light-emitting region includes a base side and a curved side connected to the base side, and the base side extends in the first direction; and in the two second sub-pixels located in the second pixel group, a base side of a light-emitting region of one second sub-pixel and a point farthest from a base side on a curved side of a light-emitting region of another second sub-pixel are located on a same straight line extending in the first direction.

14. The display panel according to claim 1, wherein the light-emitting regions of the two second sub-pixels are each in a shape of a pentagon, and a light-emitting region includes a base side, two right-angled sides respectively connected to both ends of the base side and perpendicular to the base side, and two legs respectively connected to the two right-angled sides; the base side extends in the first direction, the two legs are connected to each other, and a connection point of the two legs is a vertex;

in the two second sub-pixels located in the second pixel group, a base side of a light-emitting region of one second sub-pixel and a vertex of a light-emitting region of another second sub-pixel are located on a same straight line extending in the first direction, and a right-angled side of the light-emitting region of the one second sub-pixel is adjacent to and parallel to a right-angled side of the light-emitting region of the another second sub-pixel.

15. The display panel according to claim 1, wherein the light-emitting regions of the two second sub-pixels are each in a shape of a hexagon, and a light-emitting region includes a base side, two right-angled sides respectively connected to both ends of the base side and perpendicular to the base side, two legs respectively connected to the two right-angled sides, and a top side connected to the two legs; the base side and the top side extend in the first direction;

in the two second sub-pixels located in the second pixel group, a base side of a light-emitting region of one second sub-pixel and a top side of a light-emitting region of another second sub-pixel are located on a same straight line extending in the first direction, and a right-angled side of the light-emitting region of the one second sub-pixel is adjacent to and parallel to a right-angled side of the light-emitting region of the another second sub-pixel.

16. The display panel according to claim 1, wherein a second sub-pixel is capable of emitting green light, a first sub-pixel is capable of emitting one of red light and blue light, and a third sub-pixel is capable of emitting another of the red light and the blue light.

17. The display panel according to claim 1, wherein the plurality of sub-pixels are divided into a plurality of pixel rows, the plurality of pixel rows extend in the second direction, and the plurality of pixel rows are arranged in parallel in the first direction;

a pixel row includes a plurality of pixel units disposed sequentially in the second direction, and a pixel unit includes a first pixel group, a second pixel group and a third pixel group; pixel units of two adjacent pixel rows are disposed in a staggered manner in the second direction.

18. The display panel according to claim 1, further comprising a pixel defining layer and a light-emitting layer, wherein the pixel defining layer includes a plurality of openings; the light-emitting layer includes a plurality of light-emitting patterns, and the two second sub-pixels in the second pixel group share a same light-emitting pattern;

a light-emitting pattern corresponds to two openings, and at least part of the light-emitting pattern is located in the two corresponding openings; and geometric centers of the two openings are located on two straight lines extending in the first direction.

19. A display device, comprising the display panel according to claim 1.

20. A display panel, comprising:

a substrate, and a plurality of sub-pixels disposed on the substrate, each sub-pixel having a light-emitting region, wherein the plurality of sub-pixels are divided into a plurality of first pixel columns and a plurality of second pixel columns, the plurality of first pixel columns and the plurality of second pixel columns all extend in a first direction, and the plurality of first pixel columns and the plurality of second pixel columns are disposed alternately in a second direction; the first direction and the second direction intersect;

a first pixel column includes a plurality of first pixel groups and a plurality of third pixel groups that are disposed alternately in the first direction, a first pixel group includes two first sub-pixels disposed sequentially in the first direction in the plurality of sub-pixels, and a third pixel group includes two third sub-pixels disposed sequentially in the first direction in the plurality of sub-pixels;

a second pixel column includes a plurality of second pixel groups disposed sequentially in the first direction, a second pixel group includes two second sub-pixels disposed sequentially in the first direction in the plurality of sub-pixels, and geometric centers of light-emitting regions of the two second sub-pixels are located on two straight lines extending in the first direction;

the plurality of sub-pixels are divided into a plurality of pixel rows, the plurality of pixel rows extend in the second direction, and the plurality of pixel rows are arranged in parallel in the first direction; and a pixel row includes a plurality of pixel units disposed sequentially in the second direction, and a pixel unit includes a first pixel group, a second pixel group and a third pixel group; pixel units of two adjacent pixel rows are disposed in a staggered manner in the second direction.

* * * * *